(12) United States Patent
Baidya et al.

(10) Patent No.: US 10,915,691 B2
(45) Date of Patent: Feb. 9, 2021

(54) SEMANTIC PATTERN EXTRACTION FROM CONTINUOUS ITEMSETS

(71) Applicant: Intel Corporation, Santa Clara, CA (US)

(72) Inventors: Bikram Baidya, Portland, OR (US); Vivek K. Singh, Portland, OR (US); Allan Gu, Portland, OR (US); Abde Ali Hunaid Kagalwalla, Hillsboro, OR (US); Saumyadip Mukhopadhyay, Beaverton, OR (US); Kumara Sastry, Hillsboro, OR (US); Daniel L. Stahlke, Hillsboro, OR (US); Kritika Upreti, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/457,209

(22) Filed: Jun. 28, 2019

(65) Prior Publication Data
US 2019/0318059 A1    Oct. 17, 2019

(51) Int. Cl.
*G06F 30/30* (2020.01)
*G06F 30/398* (2020.01)
(Continued)

(52) U.S. Cl.
CPC .............. *G06F 30/398* (2020.01); *G03F 1/36* (2013.01); *G06F 16/248* (2019.01);
(Continued)

(58) Field of Classification Search
CPC .. G06F 16/9535; G06F 16/00; G06F 16/3344; G06F 16/434; G06F 16/436;
(Continued)

(56) References Cited

U.S. PATENT DOCUMENTS

2013/0259390 A1*  10/2013  Dunlop .............. G06K 9/00751
                                                                382/224
2015/0227618 A1*   8/2015  Dong ...................... G06F 16/33
                                                                707/736
2018/0150436 A2*   5/2018  Ben-Aharon ......... G06F 40/186

OTHER PUBLICATIONS

Tiezheng et al. "An Entity Relation Extraction Model Based on Semantic Pattern Matching" 2011 Eighth Web Information Systems and Application Conference. pp. 7-12. (Year: 2011).*

* cited by examiner

*Primary Examiner* — Binh C Tat
(74) *Attorney, Agent, or Firm* — Alliance IP, LLC

(57) ABSTRACT

A semantic pattern extraction system can distill tremendous amounts of silicon wafer manufacturing data to generate a small set of simple sentences (semantic patterns) describing physical design geometries that may explain manufacturing defects. The system can analyze many SEM images for manufacturing defects in areas of interest on a wafer. A tagged continuous itemset is generated from the images, with items comprising physical design feature values corresponding to the areas of interest and tagged with the presence or absence of a manufacturing defect. Entropy-based discretization converts the continuous itemset into a discretized one. Frequent set mining identifies a set of candidate semantic patterns from the discretized itemset. Candidate semantic patterns are reduced using reduction techniques and are scored. A ranked list of final semantic patterns is presented to a user. The final semantic patterns can be used to improve a manufacturing process.

27 Claims, 13 Drawing Sheets

(51) Int. Cl.
*G06F 16/2458* (2019.01)
*G06F 16/248* (2019.01)
*G03F 1/36* (2012.01)
*G06F 16/2457* (2019.01)

(52) U.S. Cl.
CPC .... *G06F 16/2465* (2019.01); *G06F 16/24578* (2019.01); *G06F 2216/03* (2013.01)

(58) Field of Classification Search
CPC ........ G06F 3/017; G06F 40/30; G06F 16/904; G06F 3/013; G06F 16/9032; G06F 3/0304; G06F 16/212; G06F 16/245; G06F 16/24522; G06F 16/35; G06F 17/18; G06F 3/012; G06F 40/268; G06F 40/279; G06F 40/284; G06F 40/289; G06F 40/35; G06F 16/3329; G06F 16/367; G06F 16/903; G06F 16/90335; G06F 16/9538; G06F 2111/10; G06F 30/20; G06F 3/011; G06F 40/295; G06F 8/65; G06F 9/451; G06F 16/24578; G06F 16/248; G06F 19/321; G06F 2203/0381; G06F 2203/04806; G06F 3/0236; G06F 3/0237; G06F 3/038; G06F 3/04845; G06F 3/04847; G06F 11/1438; G06F 11/1441; G06F 16/2358; G06F 16/24573; G06F 16/24575; G06F 16/2462; G06F 16/2465; G06F 16/29; G06F 16/337; G06F 16/43; G06F 16/51; G06F 16/738; G06F 16/951; G06F 16/953; G06F 16/955; G06F 21/568; G06F 21/575; G06F 21/62; G06F 21/6218; G06F 21/6245; G06F 2216/03; G06F 30/398; G06F 3/00; G06F 3/048; G06F 3/0482; G06F 3/0484; G06F 8/34; G06F 8/35; G06F 9/4406; G06F 9/4418; G06F 9/453; G06F 9/54; G06N 20/00; G06N 3/006; H04N 21/8456; H04N 21/4583; H04N 21/4668; A63F 13/60; A63F 13/355; A63F 13/53; A63F 13/65; G06T 3/4092; A61B 1/00045; A61B 5/7221; H01L 27/14609; H01L 27/14647
USPC ..................................................... 716/50–56
See application file for complete search history.

800

DISCRETIZED ITEMSET

{1: S ≤ 16 nm, L1 = 2.0 um, L2 = 2.2 um, fail}
{2: S ≤ 16 nm, L1 = 2.2 um, L2 = 2.0 um, fail}
{3: S ≥ 18 nm, L1 = 2.0 um, L2 = 1.8 um, pass}
{4: S ≥ 18 nm, L1 = 1.8 um, L2 = 2.4 um, pass}
{5: S ≥ 18 nm, L1 = 2.2 um, L2 = 2.6 um, pass}
{6: S ≥ 18 nm, L1 = 3.0 um, L2 = 2.8 um, pass}
{7: S ≥ 18 nm, L1 = 2.0 um, L2 = 3.0 um, pass}
{8: S ≥ 18 nm, L1 = 2.4 um, L2 = 1.8 um, pass}

SEMANTIC PATTERN EXTRACTION FROM CONTINUOUS ITEMSETS

BACKGROUND

Cutting-edge semiconductor manufacturing processes are terribly complex. Housed in billion-dollar factories and comprising hundreds of processing steps to yield a finished device, they are capable of reliably printing features as small as 10 nm hundreds of billions of times across wafers that extend a foot in diameter. Developing a new semiconductor manufacturing process requires defining a set of design rules that establish constraints that a semiconductor device must follow to ensure manufacturability. Process development also involves developing optical proximity correction (OPC) recipes that adjust physical design features before they are printed on a mask to help counter feature distortions caused by various processing steps.

Scanning electronic microscopy (SEM) images taken during wafer manufacturing can help identify physical design patterns and geometries that may explain manufacturing defects. These patterns and geometries can be used to help define the design rules and OPC recipes for a process. The manufacture of a single wafer can generate a large amount of SEM image data given the large wafer size and number of processing steps in modern processes. As a process matures, manufacturing defects occur less frequently, making them hard to find in a vast sea of SEM image data.

DETAILED DESCRIPTION

Figure 1A:
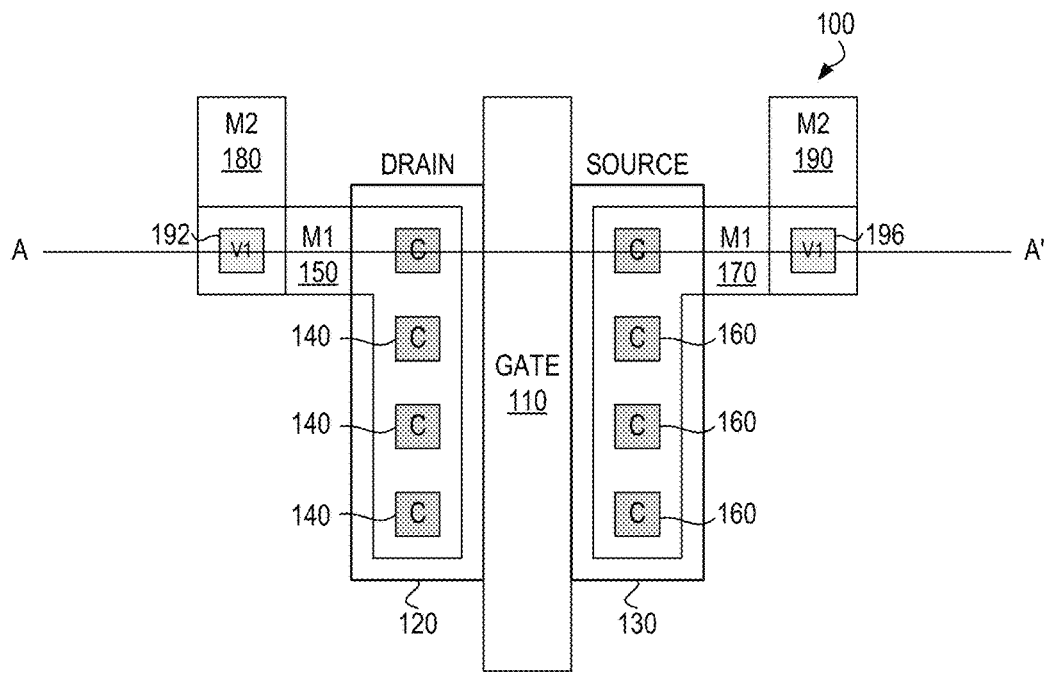
FIG. 1A illustrates the physical design of an exemplary planar transistor.

Semiconductor manufacturing has become increasingly complex over the years. Since the turn of the century, the minimum feature size has shrunk by over an order of magnitude as the industry has progressed from the 130 nm to 10 nm technology nodes. At the same time, processor complexity has dramatically increased. Current flagship products have transistor counts that well exceed 10 billion. To handle these reduced feature sizes and increased chip complexities, companies must invest billions of dollars and years of research to build state-of-the-art fabrication facilities. Research and development costs are driven ever-upward by the rising cost of increasingly sophisticated equipment needed for advanced processes. The industry has taken steps to decrease per-transistor manufacturing costs (for example, by moving from 200 mm to 300 mm wafers at the 90 nm technology node), but the overall trend has been for each process generation to cost more than the last. With up to hundreds of individual dies on wafers that span a foot in diameter, the total number of transistors that can be printed on a wafer is on the order of one trillion. Developing high-volume manufacturing processes that can reliably manufacture transistors at such an extreme scale presents considerable challenges.

One such challenge is discovering the patterns and geometries in a physical design responsible for limiting process yield. Manufacturing defects can be discovered through analysis of SEM (scanning electron microscopy) images generated during wafer manufacturing, but the amount of SEM image data that is to be analyzed to locate defects can be tremendous (up to millions of images). As a process matures, the presence of a manufacturing defect in the mountain of SEM image data that can be generated may be a rare event. Once defects are located, determining whether a particular physical design pattern or geometry is responsible for a class of defects is another difficult task, particularly considering the amount of data that to be analyzed.

The technologies described herein extract semantic patterns from large amounts of silicon data to aid in semiconductor manufacturing process development. Large numbers of SEM images are analyzed for the presence of manufacturing defects in areas of interest on a wafer. A continuous itemset is generated with items containing the values of physical design features corresponding to the areas of interest and an event value indicating the presence or absence of a manufacturing defect at that location. Entropy-based discretization is performed on the discretized itemset to generate a set of candidate semantic patterns. As used herein, the phrase "semantic pattern" refers to one of more sentences or phrases describing constraints on one or more physical design feature values. A semantic pattern can describe a single value for a feature, "gate length =20 nm," a range of values for a feature, "gate endcap space <18 nm," and constraints for multiple features, "gate length=20 nm, gate endcap space≤18 nm."

The set of candidate semantic features is reduced to a set of final semantic features that are ranked and presented to a user, such as a process engineer. The semantic features can be ranked based on their accuracy, coverage, interpretability, and independence. Generally, top-ranked semantic patterns are those that do a good job of explaining manufacturing defects (the patterns are accurate and provide good defect coverage, as will be discussed in greater detail below) and are simple for a user to understand. The user can use extracted semantic patterns to improve a process by updating the design rule set for a process, improving an optical proximity correction (OPC) recipe, or in other manners.

In the following description, specific details are set forth, but embodiments of the technologies described herein may be practiced without these specific details. Well-known circuits, structures, and techniques have not been shown in detail to avoid obscuring an understanding of this description. "An embodiment," "various embodiments," "some embodiments," and the like may include features, structures, or characteristics, but not every embodiment necessarily includes the particular features, structures, or characteristics.

Some embodiments may have some, all, or none of the features described for other embodiments. "First," "second," "third," and the like describe a common object and indicate different instances of like objects being referred to. Such adjectives do not imply objects so described must be in a given sequence, either temporally or spatially, in ranking, or in any other manner "Connected" may indicate elements are in direct physical or electrical contact with each other and "coupled" may indicate elements co-operate or interact with each other, but they may or may not be in direct physical or electrical contact.

The description may use the phrases "in an embodiment," "in embodiments," "in some embodiments," and/or "in various embodiments," each of which may refer to one or more of the same or different embodiments. Furthermore, the terms "comprising," "including," "having," and the like, as used with respect to embodiments of the present disclosure, are synonymous.

Reference is now made to the drawings, wherein similar or same numbers may be used to designate same or similar parts in different figures. The use of similar or same numbers in different figures does not mean all figures including similar or same numbers constitute a single or same embodiment.

Turning now to FIGS. 1-3, an overview of various aspects of semiconductor device manufacturing is presented. FIG. 1A illustrates the physical design of an exemplary planar transistor. As will be discussed in greater detail below, the physical design of a transistor is used to generate the masks that will be used during manufacturing to print the features on a wafer needed to implement a particular design. The physical design is typically a set of polygons drawn at various layers, such as a gate layer, contact layer, and metal-1 layer.

Transistor 100 is a field-effect-transistor (FET), the transistor type that comprises the bulk of transistors used in modern semiconductor devices. Transistor 100 comprises gate 110, drain 120, and source 130 regions. The gate region in a FET can be thought of as an "on-off" switch that controls the flow of current between drain and source regions. When gate 110 is "off", there is no (or little) current flowing through a channel region that connects drain 120 to source 130 and when gate 110 is "on", current readily flows through the channel region. Transistor 100 is connected to other transistors by a set of interconnect layers stacked vertically on top of transistor 100. Contacts 140 connect drain 120 to segment 150 of a first metal layer (M1), and contacts 160 connect source 130 to M1 segment 170. M1 segments 150 and 170 are in turn connected to second metal layer (M2) segments 180 and 190 by a first layer of "vias" (V1) 192 and 196, respectively. In general, metal layer thickness increases as one moves up the interconnect stack, with thinner lower-level metals being generally used for the local routing of signals and thicker upper-level metals being used for global signal routing and power/ground planes. For simplicity, FIG. 1A shows only two levels of metal. Current semiconductor manufacturing processing have up to ten layers of metal interconnects.

Figure 1B:
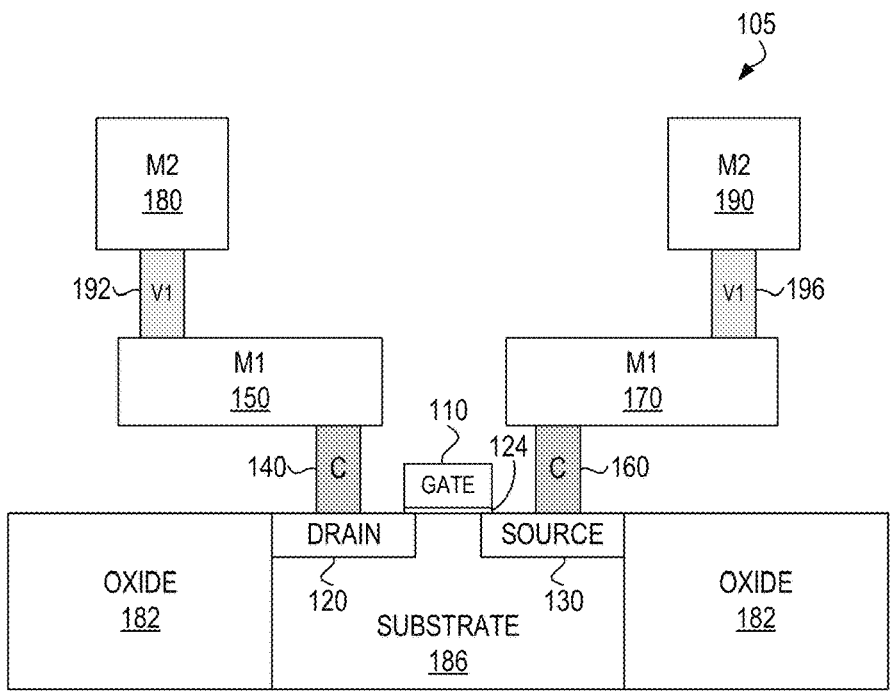
FIG. 1B illustrates an exemplary cross-section of the planar transistor of FIG. 1A taken along the line A-A'.

FIG. 1B illustrates an exemplary cross-section of the planar transistor of FIG. 1A taken along the line A-A'. Cross-section 105 shows gate 110 separated from drain 120 and source 130 regions by high-k dielectric layer 124, which electrically insulates gate 110 from drain 120 and source 130. Transistor 100 is in substrate region 186 and is insulated from adjacent transistors by oxide regions 182. The planar transistor illustrated in FIGS. 1A and 1B is just one type of transistor topography, the planar nature of the transistor reflecting that the gate, source, and drain regions are located on or are adjacent to a relatively planar surface. Another type of transistor topography is the non-planar transistor topography used in FinFETS, which are used extensively in cutting-edge manufacturing processes. FinFETS are field-effect transistors that operate under the same general principle as planar FET transistors—a gate controls the flow of current between drain and source region—with the variation that the gate wraps around a set of fins that extend vertically upwards from the wafer surface.

Essential to semiconductor manufacturing is the process of photolithography, by which patterns are transferred from a mask onto a wafer. As previously mentioned, masks are used to define the shape and location of various features to be patterned on a wafer for a given process layer. For example, one mask defines where oxide regions are located, another mask defines where high-k dielectrics will be located, another mask defines the locations of source and drain regions, and yet another mask defines where contacts will be placed. Additional masks are used to define each metal layer and intervening via layers.

Figure 2A:
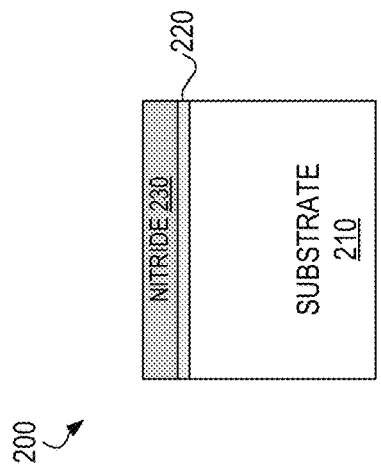
FIGS. 2A-2F illustrate an exemplary photolithography process.
Figure 2B:
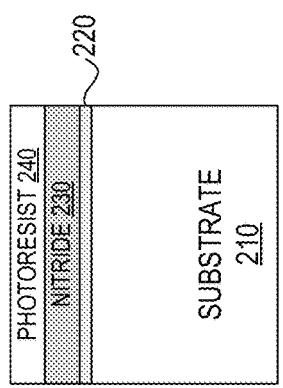
Figure 2C:
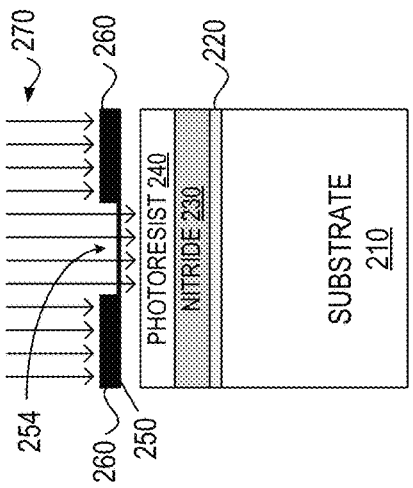
Figure 2D:
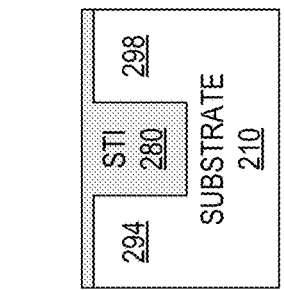
Figure 2E:
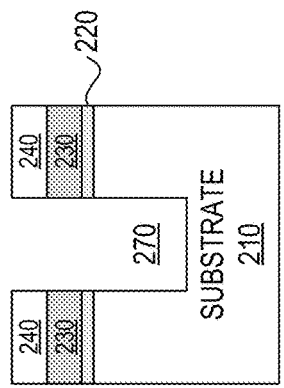
Figure 2F:
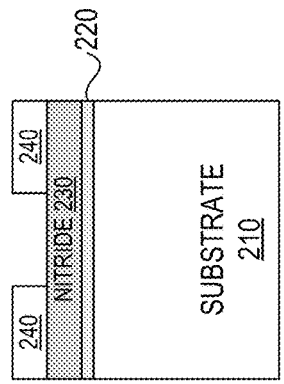

FIGS. 2A-2F illustrate an exemplary photolithography process. Process 200 illustrates how the oxide regions 182 in FIG. 1B can be defined using photolithography. In FIG. 2A, a thin silicon dioxide layer 220 is thermally grown across the top of silicon substrate 210 of a wafer. Silicon nitride layer 230, a protective layer, is deposited on top of silicon dioxide layer 220. In FIG. 2B, photoresist 240 is deposited on top of nitride layer 230. A photoresist is a material whose reactance to an etchant or solvent increases (if a positive photoresist) or decreases (negative photoresist) upon exposure to light. In process 200, photoresist 240 is a positive photoresist. In FIG. 2C, mask 250 with patterns 260 is positioned over the wafer and exposed to light 270. The light 270 passes through transparent region 254 of mask 250 and exposes photoresist 240. Patterned regions 260 are opaque to light 270 and the photoresist regions under patterns 260 are not exposed. In FIG. 2D, photoresist 240 is chemically developed and the exposed regions are dissolved. The remaining portions of photoresist 240 can now act as an on-wafer mask to allow for selective processing of the wafer. In FIG. 2E, the wafer is subjected to an etch step that removes a portion of the silicon nitride layer 230, silicon dioxide layer 220, and substrate 210 to create trench 270. In FIG. 2F, the photoresist and nitride layers are removed, and trench 270 is filled with silicon dioxide to create a shallow trench isolation (STI) region 280 that serves to keep transistors formed in regions 294 and 298 electrically isolated from each other.

As masks are the means by which features are realized in semiconductor devices, any semiconductor device design must ultimately be reduced to a physical design, the level of design abstraction from which masks are be generated. The physical design of a transistor (such as FIG. 1A), circuit, or processor to be manufactured is often referred to as a "layout." Electronic design automation (EDA) tools allow processor architects and circuit designers to design at levels of abstraction above the physical design level. They are thus spared from having to spend their days drawing polygons in layout tools to realize their designs. Architects typically define their designs using a hardware design language (HDL), such as VHDL or Verilog. Once they have verified that their designs perform as desired, a physical design can be generated automatically using a library of standard layout cells. Circuit designers often seek performance or functionality not available using standard cells and often enter their designs into a schematic capture tool. Once their custom designs are finalized, the circuit schematics are handed off to layout designers who manually craft the custom physical designs.

Regardless of whether a physical design is generated automatically or manually it must conform to a set layout design rules established for a manufacturing process. Design rules are constraints that a physical design must follow to ensure manufacturability. Most design rules express a minimum width or space for a feature, such as, "gate length≥10 nm," "source/drain diffusion enclosure of a contact≥16 nm," and "space between metal-1 traces≥20 nm." Design rules represent a trade-off between feature density and manufacturability. Being able to print smaller feature sizes can mean more die can be packed onto a wafer but if the process cannot reliably print the smaller features, the resulting reduction in wafer yield can more than offset cost reduction gained by being able to print more die on a wafer.

Developing design rules for a new process can be difficult as unexpected difficulties can arise. For example, a feature may not scale as much as expected from the previous technology generation due to unforeseen difficulties with a new processing step or a new tool. As process engineers develop a new manufacturing process, they continually fine-tune the individual processing steps to remove as many defect sources as possible. At some point, the process has been tuned enough that the remaining defects that need to be rooted out occur so infrequently that they are difficult to find. Process engineers need to find the occurrence of these rare events during process development so that they can determine whether a tweak to the process can be figured out to reduce the occurrence of the rare event, or to add a design rule to the design rule set so that physical design geometries and patterns correlated to a specific defect are kept out of the final physical design.

Once a physical design is clear of design rule violations and has passed other design validation checks, it is passed to the mask generation phase of an EDA flow. The mask generation phase is far from trivial due to the large discrepancy between the wavelength of the light (λ=193 nm) that has been used since the 90 nm technology node and the minimum feature sizes (10 nm) used in the current processes. The minimum feature size that can be printed clearly in a photolithographic process is limited by the wavelength of the light source used and the semiconductor industry has developed resolution enhancement technologies (RET) to allow for the printing of features well below the 193 nm light source wavelength. A first set of RET techniques works to increase resolution and/or depth of focus, and a second set compensates for distortion effect due to printing features with a wavelength larger than minimum feature sizes as well as those inherent in deposition, etching, and other process steps. The first set includes techniques such as phase-shift masks and double-patterning, and the second set includes optical proximity correction (OPC).

Figure 3A:
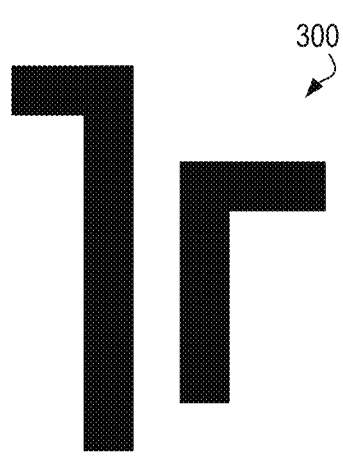
FIGS. 3A-3D illustrate differences between features printed on a mask and those processed on a wafer due to process distortion effects and the use of optical proximity correction to counter those effects.
Figure 3B:
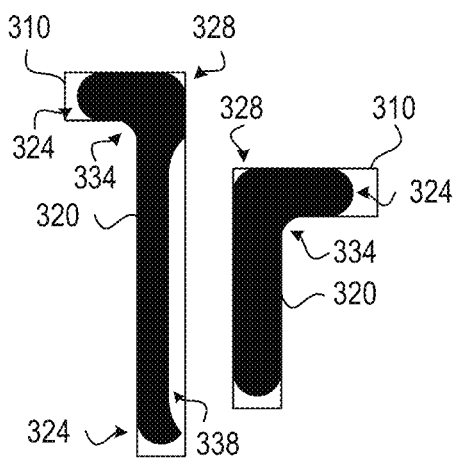
Figure 3C:
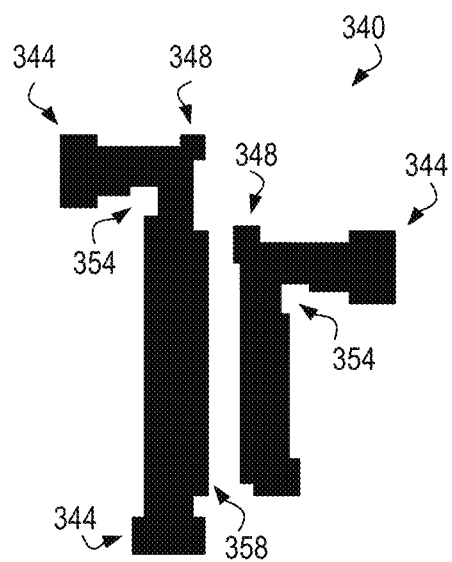
Figure 3D:
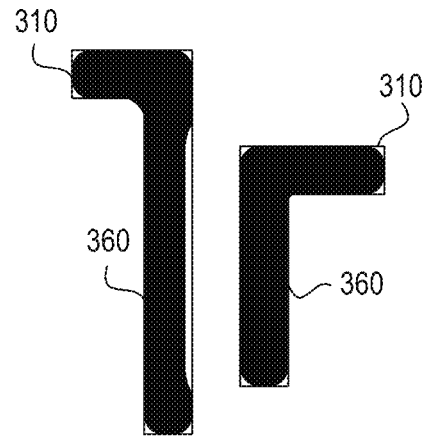

FIGS. 3A-3D illustrate differences between features printed on a mask and those processed on a wafer due to process distortion effects and the use of optical proximity correction to counter those effects. FIG. 3A illustrates two gate polygons 300 in a physical design before being subjected to an OPC process. FIG. 3B illustrates a simplified view of how polygons 300 may appear as processed on a wafer. Outlines 310 represent the boundaries of polygons 300 and shapes 320 represent the corresponding as-processed features. It can be seen that ends 324 and exterior corners 328 of shapes 320 are rounded off, interior corners 334 are filled in, and segment 338 narrowed due to a nearby feature. FIG. 3C illustrates exemplary modified polygons 340 generated by subjecting polygons 300 to an OPC process. Modified polygons 340 are much more complex than original polygons 300. Modified polygons 340 include "dog-bone" features 344 that compensate for end-rounding, "ear" features 348 that compensate for exterior corner-rounding, "mouse-bite" features 354 that compensate for interior corner-rounding, and thickening features 358 that compensate for the presence of nearby features. FIG. 3D illustrates a simplified view of how modified polygons 340 may appear on a wafer after processing. Outlines 310 again represent the boundaries of original polygons 300. As can be seen, modification of polygons 300 by the OPC process results in printed shapes 360 that are closer to the shape and size of original polygons 300. The ends and corners of shapes 360 are less rounded off, the interior corners are less filled in, and the impact of nearby neighbors is diminished.

While OPC generation (and other RET techniques) have allowed minimal features to scale with technology node as the wavelength of the photolithographic light source has remained constant, it does not come without its costs. OPC generation is computationally intensive. OPC recipes can be based on physical models of various processing steps (photolithography, diffusion, etch, deposition, etc.), or be rule-based models that generate OPC features based on individual physical design feature characteristics (width, length, shape, nearest-neighbor characteristics) without relying on the physics of the underlying process steps. The application of model-based OPC recipes to a complete physical design may involve the application of physical models to over 10 billion shapes at the gate layer alone and to billions of additional shapes on other layers. Further, the generation of rule-based OPC models, which may save some of the computational complexity of model-based OPC generation, can be a complex affair. Generation of rule-based OPC recipes can be based on trial-and-error due to a lack of full understanding of the complex physics and chemistries at play in the development of cutting-edge processing technologies. This trial-and-error can comprise iteratively manufacturing features with many variations of candidate OPC recipes and seeing which recipes produce the best results.

Figure 4:
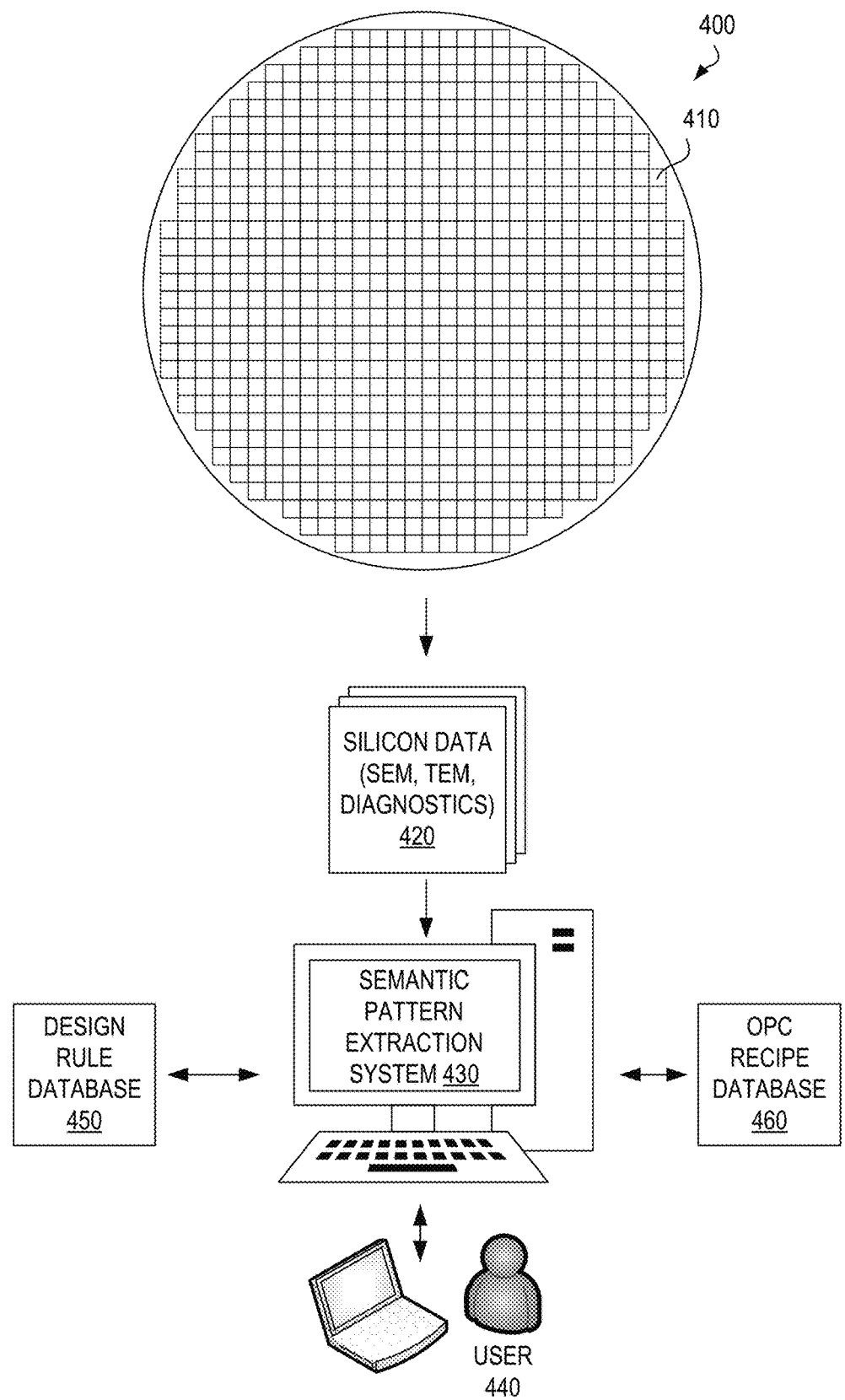
FIG. 4 illustrates an embodiment of silicon data capture and utilization of silicon data to aid semiconductor manufacturing process development.

FIG. 4 illustrates an embodiment of silicon data capture and utilization of silicon data to aid semiconductor manufacturing process development. Silicon wafer 400 comprises dies 410. As discussed earlier, current technology nodes employ 300 mm wafers, which can comprise hundreds of dies. The dies are separated by scribe lines that can contain test structures that can be used to monitor the health of a manufacturing process and that are consumed by the dicing process, where a wafer is cut into individual dies 410. During the manufacture of silicon wafer 400, silicon data 420 can be generated that can be used for the development of a new process or to monitor the health of a mature one. Silicon data 420 can be any data collected during the manufacturing of wafer 400, including SEM (scanning electron microscopy) images, TEM (transmission electron microscopy) images, and diagnostic data. Diagnostic data can include data collected from the scribe line test structures, which can measure electrical properties of varies features or layers (e.g., contact or via resistance, metal layer sheet resistance), or indicate the presence of manufacturing defects by testing for shorts between, for example, gate or metal structures that reflect minimum features or layout patterns of concern.

Any number of SEM images can be generated per wafer. SEM images can be taken of one or more areas of interest on an individual die for various die on a wafer. For example, SEM images may be taken of the gate layer in a region where the gate patterns are particularly dense (such as in a memory array) and for representative dies across the wafer to capture cross-wafer manufacturing variations. SEM images can be taken at any point in the manufacturing process. As SEM images can capture a field of view that is hundreds of microns in length and width, individual images can contain many instances of minimum features or areas of interest.

Silicon data 420 can be generated for wafers processed during process development or monitoring and can be generated for wafers processed across fabrication facilities to evaluate cross-facility manufacturing robustness. Given today's large wafer sizes, process complexities, and wafer run rates, the amount of silicon data that can produced during process development or monitoring can be tremendous. The number of SEM images generated during process development alone can reach into the millions.

As will be discussed in further detail below, silicon data 420 can be supplied to a semantic pattern extraction system 430 that digests copious amounts of silicon data and presents to a process engineer or other user 440 information that may useful in developing a new process or improving an existing one. In some examples, the information provided can be semantic patterns (phrases or sentences that are easily understandable by a human) that suggest which physical design patterns or geometries may be responsible for a defect. In other examples, system 430 can determine one or more design rules that may improve process yield and update design rule database 450 for a process or update an OPC recipe database 460 by updating an existing OPC recipe or creating a new one that may improve yield.

Figure 5:
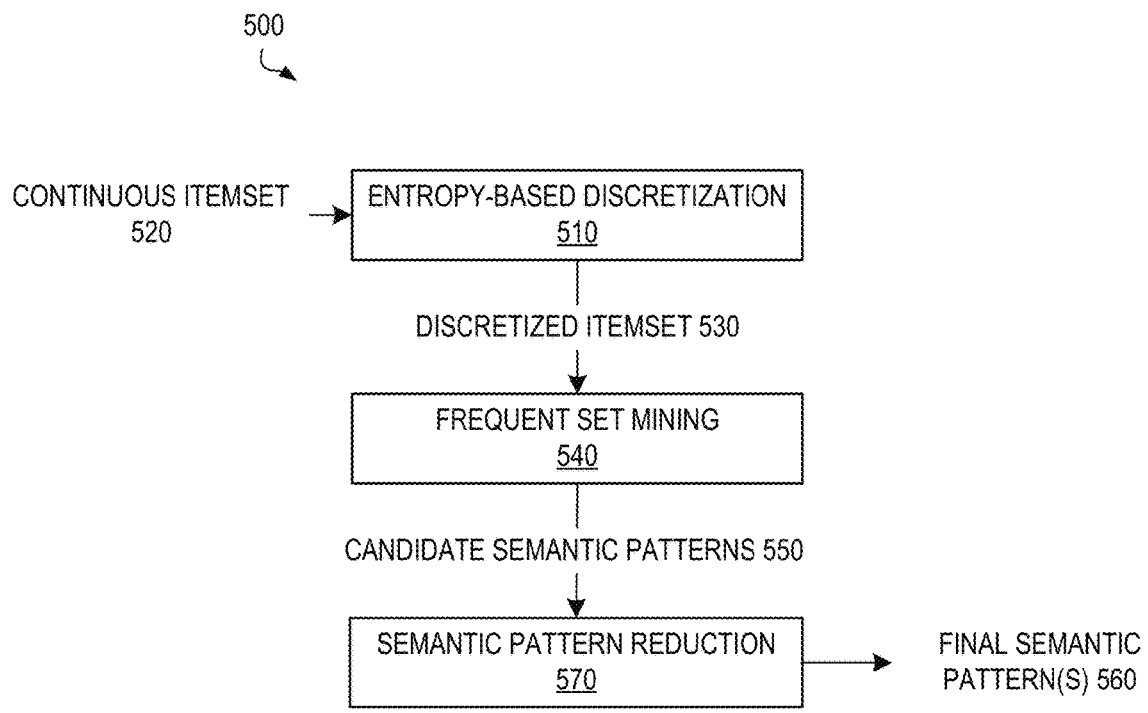
FIG. 5 illustrates a first exemplary method for generating semantic patterns from a continuous itemset.

FIG. 5 illustrates a first exemplary method for generating semantic patterns from a continuous itemset. The method 500 performs entropy-based discretization 510 on continuous itemset 520 to generate discretized itemset 530. Frequent set mining 540 is performed on discretized itemset 530 to generate candidate semantic patterns 550, which is reduced to one or more final semantic patterns 560 by semantic pattern reduction 570.

Figure 6:
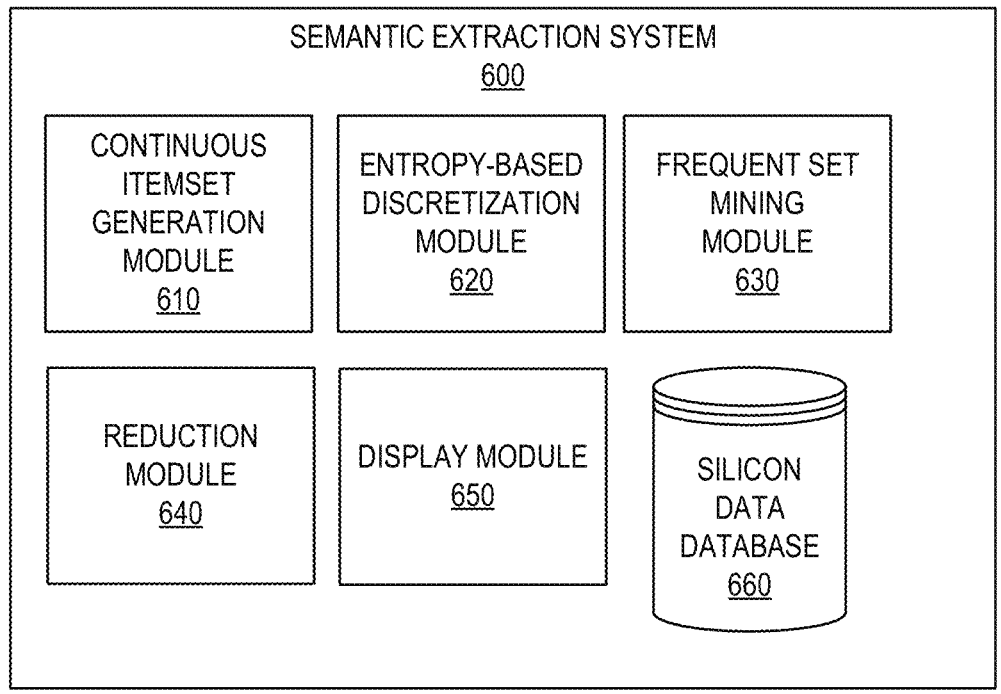
FIG. 6 illustrates an exemplary semantic pattern extraction system.

FIG. 6 illustrates an exemplary semantic pattern extraction system. In one embodiment, semantic pattern extraction system 600 can perform method 500. Semantic pattern extraction system 600 comprises continuous itemset generation module 610, entropy-based discretizaton module 620, frequent set mining module 630, reduction module 640, a display module 650, and silicon data database 660. Continuous itemset generation module 610 generates continuous itemsets from silicon data generated during wafer manufacturing. The continuous itemset forms the data set from which semantic patterns are extracted. Entropy-based discretization module 620 discretizes the continuous itemset. Frequent set mining module 630 performs frequent set mining on the discretized itemset to identify candidate semantic patterns. Reduction module 640 reduces the candidate set of semantic patterns to a ranked set of final semantic patterns. The display module 650 display the final semantic patterns to a user, such as a process engineer. The final semantic patterns can be displayed in a ranked order. The extracted semantic patterns can be used to update a design rule database, update an OPC recipe or otherwise to improve a process. The silicon data database 660 can comprise, for example, SEM images, TEM images, diagnostic data or other silicon data generated during wafer manufacturing from which continuous itemsets can be generated.

Semantic pattern extraction system 600 can be implemented in various manners. In one embodiment, system 600 comprises a dedicated high-performance workstation or server. In other embodiments, system 600 comprises one or more software applications running on computing resources located in one or more private, hybrid, or public cloud environments. System 600 can present extracted semantic patterns on a display that is local or remote to the system 600. For example, extracted semantic patterns can be displayed on a monitor, laptop, tablet, phone or any other display on any stationary or mobile device. Silicon data database 660 can similarly be stored in various manners. Silicon data database 660 can be stored local to a workstation or server or be stored remotely on dedicated or distributed storage resources in one or more private, hybrid, or public cloud environments, or on any other remote storage.

Figure 7:
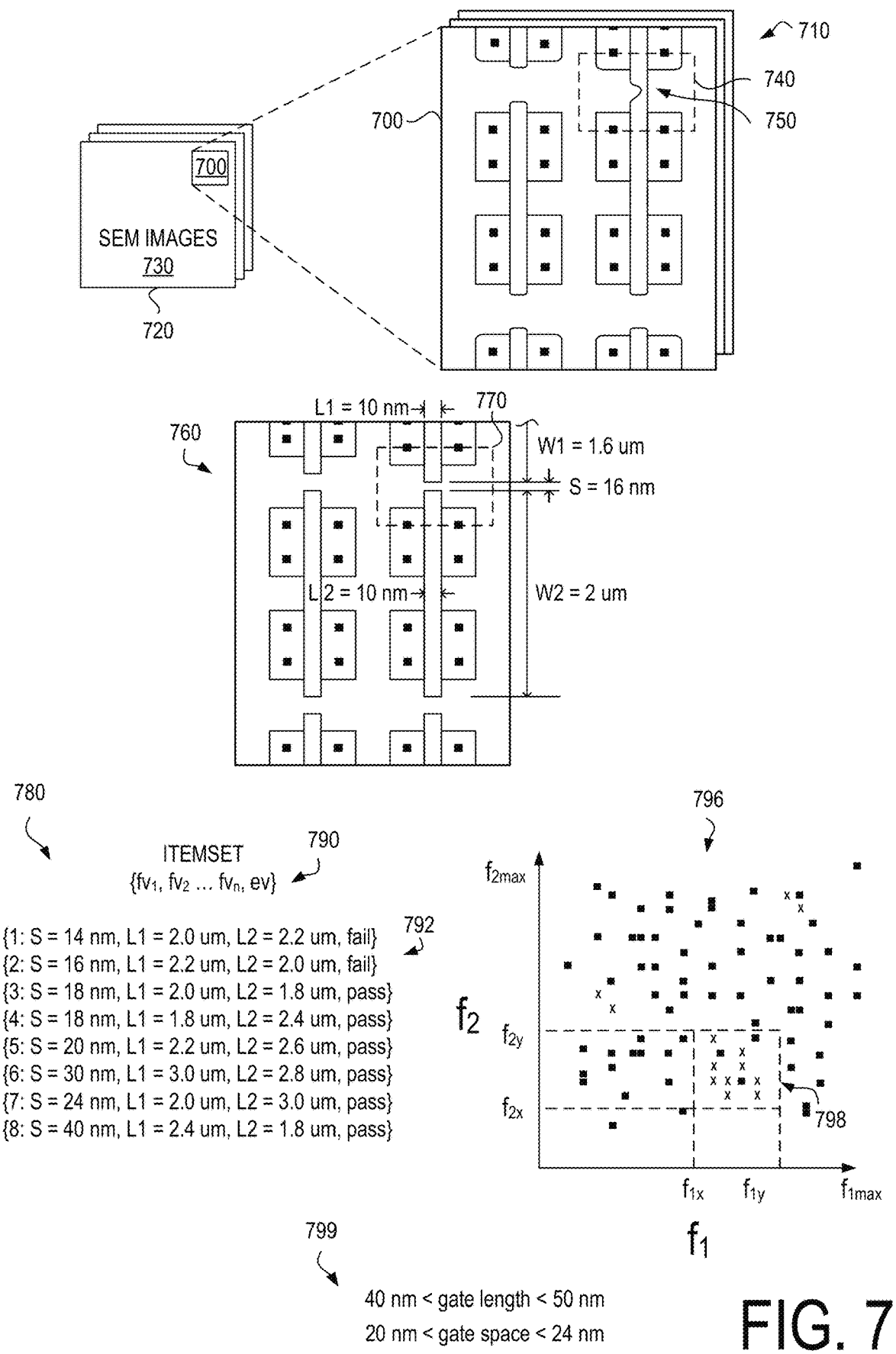
FIG. 7 illustrates an exemplary generation of a continuous itemset from SEM images.

FIG. 7 illustrates an exemplary generation of a continuous itemset from SEM images. The generation of continuous itemsets illustrated in FIG. 7 can be performed by, for example, continuous itemset generation module 610 of system 600. As discussed previously, an SEM image can capture a field of view hundreds of microns in height and width and can include a plurality of areas of interest where processed features are to be monitored. Image portion 700 is one of a set of image portions 710 of single SEM image 720 from a set of SEM images 730 taken during the manufacture of one or more wafers. Image portion 700 comprises area 740, where processing of a minimum-sized gate endcap space resulted in manufacturing defect 750, the defect comprising two gate endcaps being shorted together. Manufacturing defect detection can be performed by analyzing feature contours extracted from SEM images. The presence of a defect can be determined by, for example, comparing extracted feature contours to a database of manufacturing defects, determining whether the width of a processed feature is below a threshold, or other methods. SEM image portions of other layers can have different features analyzed. For example, an SEM image taken after processing of a metal-1 layer can be analyzed for the presence of shorts between metal-1 traces.

Individual items in a continuous itemset can contain physical design feature values of the area of the physical design corresponding to an area of interest in an SEM image, and an indication of whether the area of interest contained a manufacturing defect. As discussed previously, physical design feature values can include the width, space, and length of a physical design feature, the feature's enclosure of a feature on another layer, physical design values of a nearby physical design features on the same layer, etc. For example, the physical design feature values of area 770 of physical design portion 760 corresponding to area of interest 740 in SEM image portion 700 include gate endcap spacing (S=16 nm) and the gate length of the corresponding gate traces (L1=10 nm, L2=10 nm). Because this region was manufactured with a defect, the defect can be indicated by the word "fail", or any other word, number, or code signifying the presence of defect. The absence of a defect can be similarly represented (for example, by the word "pass"). Thus, in one embodiment, the item generated for area of interest 740 in image 700 corresponding to area 770 of physical design portion 760 that resulted in the manufacture of defect 750 could be {S=16 nm, L1=10 nm, L2=10 nm, fail}. The item could include additional information, such as the width of the two gate traces (W1=1.6 um, W2=2.0 um). In some embodiments, the itemset can include information not relating to physical design, such as wafer number and fab ID, to capture the dependency of manufacturing defects on which factory the wafer was manufactured in, the time of day that the wafer was manufactured, etc.

Continuous itemset 780 is an exemplary itemset generated by a semantic extraction system. In some embodiments, items in itemset 780 follow item format 790: a set of feature values ($f_{v1}, f_{v2} \ldots f_{vn}$) and an event value (ev) indicating the presence of an event, such as the presence or absence of a manufacturing defect. Tagging the items with an event indicating the presence or absence of a defect makes the itemset a tagged or labelled itemset. Items 792 are a set of exemplary items that follow the format {gate endcap spacing, gate endcap length 1, gate endcap length 2, pass|fail}. In other embodiments, items 792 could have feature values for additional features. One advantage of having items with more feature values is to capture unexpected sources of defects. For example, while gate endcap length may be a primary factor contributing to the manufacturability of gate endcaps spaced a minimum distance apart, the space of a gate endcap to another nearby neighbor may unexpectedly impact process yield.

Graph 796 shows an exemplary distribution of defects in a continuous itemset along physical design feature axes $f_1$ and $f_2$. The "X"s indicate the presence of a manufacturing defect and squares indicates the absence of one. Cluster 798 suggests that physical design patterns having an $f_1$ value between $f_{1x}$ and $f_{1y}$ and an $f_2$ value between $f_{2x}$ and $f_{2y}$, are likely to result in a manufacturing defect and may want to be avoided in a physical design. Thus, if $f_1$ is gate length and $f_2$ is gate space, the technologies described herein could extract semantic pattern 799, "40 nm<gate length<50 nm; 20 nm<gate space<24 nm."

Although the discussion of FIG. 7 has been directed to the generation of continuous itemsets based on SEM data, in some embodiments, a continuous itemset can include items generated from other silicon data sources, such as TEM images and scribe line test structure diagnostic data. An exemplary item format based on TEM images could be {wafer x-position, wafer y-position, pass|fail}. An exemplary item format based on diagnostic data could be {wafer x-position, wafer y-position, minimum physical design feature dimension represented in the test structure, pass|fail}.

Regardless of how many feature values are included in items, a continuous itemset generated from silicon data produced during high-volume production or process development could be quite large. Millions of SEM images can be generated in either environment. As a process matures, items tagged with a defect may occur less and less frequently. Frequent set mining applied to large continuous itemsets with items infrequently tagged with defects can yield a set of frequent items that does not lend itself to easy comprehension by a user. For example, frequent set mining (FSM) techniques, such as commonly used algorithms like Apriori or Eclat, can produce a large set of frequent items, which may not be useful to a user looking for a relatively simple set of physical design feature patterns or geometries (such as semantic pattern 799) to explain a defect. Further, the domain of values for a physical design feature can have a large domain. In physical design CAD tools, polygons are drawn with vertices that attach to a grid that has a specified spacing between grid points. For example, if the grid spacing is 1 nm at the 10 nm technology node and the gate lengths in a design vary between 10 nm and 100 nm, the gate length domain contains 91 unique values. The domains of dimensions that typically vary more widely in a design, such as gate width and spacing can have hundreds of unique values. With such a small interval between successive domain values, frequent set mining could yield a large set of frequent items tagged with defects, which, again, may not be useful to a user looking for a relatively simple set of patterns and geometries to explain the defect. Moreover, frequent items identified by FSM techniques may not be associated with the presence of a manufacturing defect; they may simply be combinations of physical design feature values that happen to occur frequently in the itemset. This can present noise in the set of frequent items that a user has to sift through.

Figure 8:
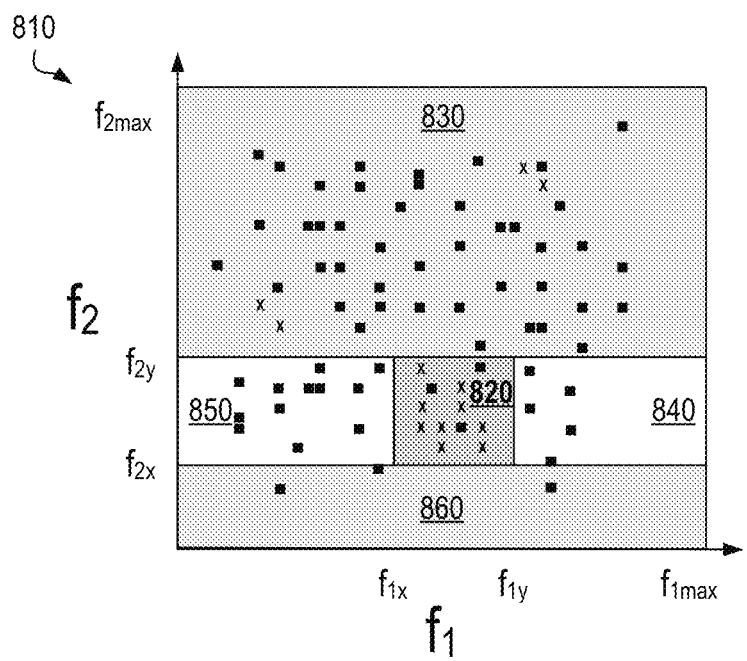
FIG. 8 illustrates an exemplary discretized itemset and an exemplary discretization of a continuous itemset.

FIG. 8 illustrates an exemplary discretized itemset and an exemplary entropy-based discretization of a continuous itemset. Entropy-based discretization can be performed by, for example, entropy-based discretization module 620 of semantic extraction system 600. Although reference is made throughout to continuous itemsets, this does not mean that physical design feature values in a continuous itemset are not discretized. As previously discussed, physical design features are generally discretized at the level of the physical design CAD tool grid spacing. This can be a very fine discretization (e.g., 1 nm), but such itemsets are herein referred to as continuous to distinguish them from discretized itemsets generated by entropy-based discretization. Entropy-based discretization replaces the value for a physical design feature in an item with a value or range of values taken from a set of discretized values or ranges. Generally, the number of values or ranges in the discretized set is less (and in some cases much less) than the number of values in the domain for the physical design feature values in the continuous itemset.

In some embodiments, entropy-based discretization uses a recursive algorithm to split the physical design feature domain range of a continuous itemset into smaller and smaller bins with the goal of reducing entropy, which is a measure of the homogeneity of event values for items within a proposed split of physical design features. In other words, as applied to a continuous itemset labelled with the presence or absence of manufacturing defects, the entropy algorithm operates to split the feature value domain into bins where most items in the individual bins either are all tagged with the presence of a defect or are all tagged with the absence of defect. Referring back to graph 796 in FIG. 7, an entropy-based discretization algorithm may divide the $f_1$ domain range into three bins: $0 < f_1 \leq f_{1x}$, $f_{1x} < f_1 \leq f_{1y}$, $f_{1y} < f_{1max}$, and also divide the $f_2$ domain into three bins: $0 < f_2 \leq f_{2x}$, $f_{2x} < f_2 \leq f_{2y}$, $f_{2y} < f_{2max}$. The recursive discretization algorithm can operate by, in an iteration, determining various candidate splits for a physical design feature, each split dividing the physical design feature values into one or more bins (i.e., a first split dividing the feature into three bins (bin 1: $0 < f_1 \leq f_{1x}$, bin 2: $f_{1x} < f_1 \leq f_{1y}$, bin 3: $f_{1y} < f_{1max}$), a second dividing the feature into a set of different bins), calculating the entropy for each candidate split, and choosing the split with the lowest calculated entropy. The algorithm can be repeated for individual bins with the chosen split, resulting in the further splitting of bins (e.g., further splitting the $0 < f_1 \leq f_{1x}$ bin). Iterations can continue until the overall entropy for a feature is below a specified level, a certain number of bins are reached, or no further reduction of entropy is achieved by further splitting. This discretization can occur for one or more for physical design features in a continuous itemset.

In a discretized itemset, the binning is represented in the discretized items by the values of the discretized physical features being able to take a value or range from a set of discretized physical feature values or ranges. For example, the discretized itemset 800 comprises the items of continuous itemset 780 with the gate endcap spacing value being able to take only one of two discretized physical feature ranges: S <16 nm (items 1-2) or S >18 nm (items 3-8).

Continuous itemsets having a greater number of items than continuous itemset 780 can be discretized into discretized itemsets having more bins than discretized itemset 800 and that are discretized along multiple features. For example, graph 810 shows how an entropy-based discretization algorithm could discretize the items represented by graph 796. Bin 820 comprises items having $f_1$ values $f_{1x} < f_1 \leq f_{1y}$, and $f_2$ values $f_{2x} < f_2 \leq f_{2y}$. The remaining items could be grouped into additional bins 830, 840, 850, 860 comprising items predominantly tagged with the absence of a manufacturing defect. Thus, in the discretized itemset, $f_1$ values would be limited to the set of discretized physical feature values: $\{0 < f_1 \leq f_{1x}, f_{1x} < f_1 \leq f_{1y}, f_{1y} < f_{1max}\}$ and $f_2$ values would be limited to the following set of discretized physical feature values: $\{0 < f_2 \leq f_{2x}, f_{2x} < f_2 \leq f_{2y}, f_{2y} < f_{2max}\}$.

After a discretized itemset is generated, frequent set mining can be performed to generate a set of candidate semantic patterns. Frequent set mining can be performed by, for example, frequent set mining module 630 of semantic extraction system 600. In one embodiment, frequent set mining searches the discretized itemset for the most frequently occurring discretized items. An item in the discretized itemset can be determined to be a frequent itemset if it occurs more than a threshold number of times, is one of the most frequent items (e.g., top 5, top 10, top 100, top N), or by other methods. For each of the identified frequent discretized item, an identified candidate semantic pattern is generated from the physical design feature values in the frequent discretized items.

The set of candidate semantic patterns, while indicative of which physical design patterns and geometries may be responsible for manufacturing defects, may still not be in an easily understandable form for users. In some embodiments, the set of candidate semantic patterns is reduced to a set of final semantic patterns that is more easily understood. In one embodiment, reduction techniques are employed to reduce the set of candidate semantic patterns to a set of final semantic patterns. The final semantic patterns can be ranked based on various properties including accuracy, coverage, interpretability, and independence.

In one embodiment, the candidate semantic patterns are reduced to a set of final semantic patterns using a graph-based reduction method to identify independent semantic patterns. In one embodiment, two semantic patterns A and B are considered independent if the itemset does not have any item that can be described by both A and B. In one embodiment, a graph-based reduction method reduces a set candidate of semantic patterns as follows. A graph is created wherein nodes correspond to a candidate semantic pattern and two nodes are connected by an edge if the semantic patterns corresponding to the connecting nodes are not independent. An iterative greedy algorithm is then applied to determine the least-connected nodes (the nodes with zero or the fewest numbers of edges to neighboring nodes) from the graph. For the least-connected nodes, the candidate semantic patterns associated with the least-connected node and any neighboring nodes connected to the least-connected node are collectively identified as a final semantic pattern. The identified least-connected nodes and any neighboring nodes are removed from the graph, ending an iteration of the algorithm. The algorithm is repeated until the graph becomes empty. In some embodiments, the final semantic patterns can be given an independence ranking or score, with final semantic patterns identified in earlier iterations of the greedy algorithm having higher independence rankings or scores than final semantic patterns identified in later iterations.

Figure 9:
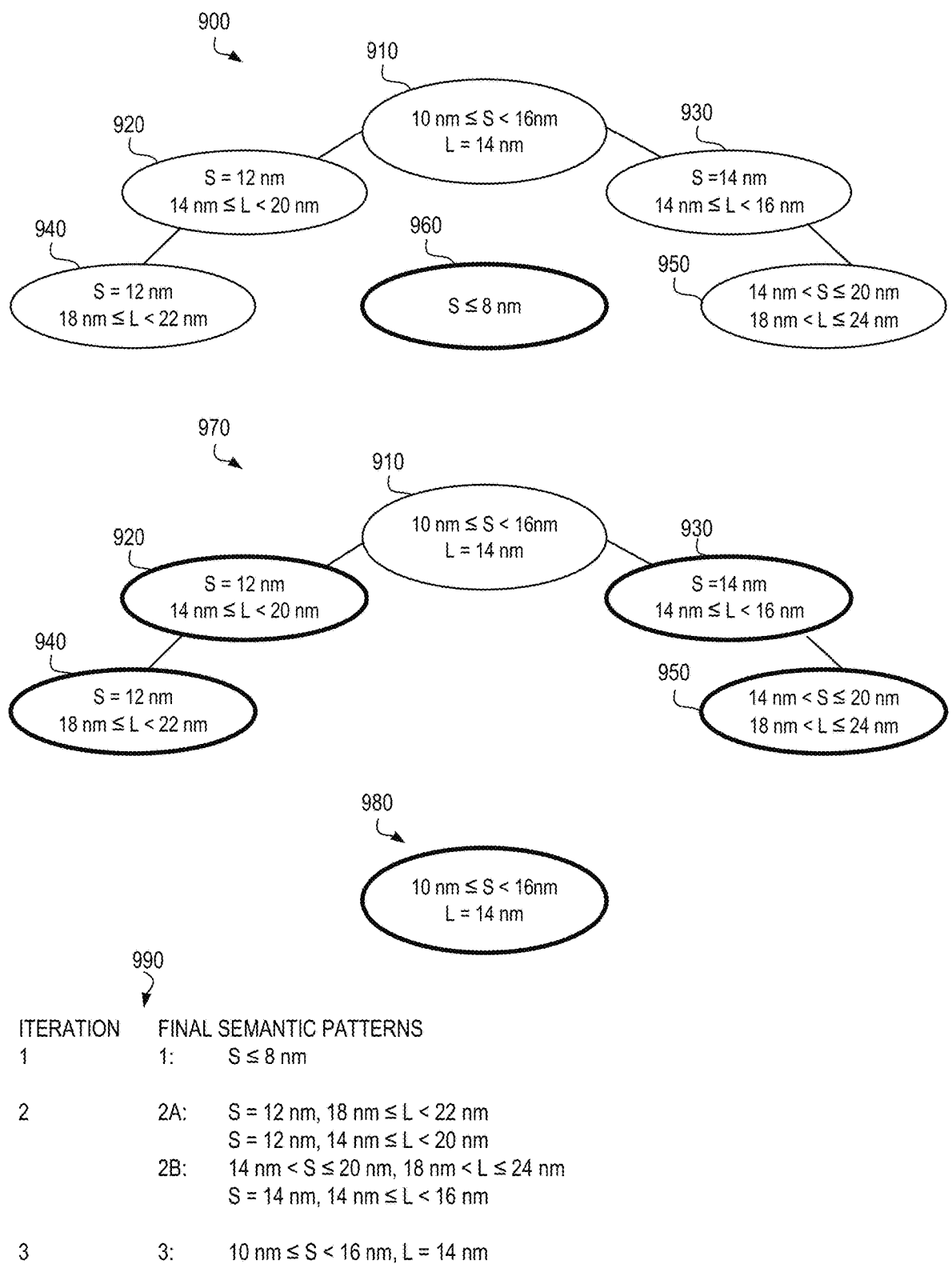
FIG. 9 illustrates an exemplary graph-based reduction of candidate semantic patterns.

FIG. 9 illustrates an exemplary graph-based reduction of candidate semantic patterns. In some embodiments, the reduction module 640 of semantic extraction system 600 can perform the reduction illustrated in FIG. 9. Graph 900 comprises a set of nodes associated with a set of candidate semantic patterns. Node 910 is connected to nodes 920 and 930 as some of the items that can be described by the semantic pattern associated with node 910 can also be described by the semantic pattern associated with either of nodes 920 or 930. Node pairs 920-940 and 930-950 are also connected for not being independent of each other. The semantic pattern associated with node 960 is independent of the semantic patterns associated with all other nodes in graph 900 and is left unconnected. In a first iteration, the greedy algorithm identifies node 960 as the least-connected node (highlighted in FIG. 9) as it is connectionless and is thus the most independent semantic pattern in the candidate semantic pattern set. The candidate semantic pattern associated with node 960 is placed at the top of a ranked list 990 as the first semantic pattern generated by the reduction method.

Graph 970 illustrates graph 900 with node 960 removed, at the start of a second iteration of the reduction algorithm. The algorithm identifies nodes 940 and 950 as the least-connected nodes in this iteration as they both have one connection to neighboring nodes. The candidate semantic patterns associated with connected nodes 920 and 940 are combined and added to ranked list 990 as final semantic pattern 2A and are ranked below final semantic pattern 1. The candidate semantic patterns associated with connected nodes 930 and 950 are also combined and added to ranked list 990 as final semantic pattern 2B. Final semantic patterns 2A and 2B are given the same independence ranking as they are extracted during the same iteration of the reduction algorithm. Node pairs 920-940 and 930-950 are removed from the graph.

Graph 980 illustrates graph 970 with nodes 920, 930, 940, 950 removed, at the start of a third iteration of the reduction algorithm. Node 980 is identified as the least-connected node as it is the only remaining node and the candidate semantic pattern associated with node 980 is added to the bottom of ranked list 990. With the graph empty, the reduction algorithm is complete, and the set of six candidate semantic patterns has been reduced to a set of four final semantic patterns and been given independence scores.

In some embodiments, the final semantic patterns can be further scored based on their accuracy, coverage, and interpretability. A final semantic pattern's accuracy (or precision) is the fraction of items in the discretized itemset covered by the final semantic pattern that are tagged with a manufacturing defect. A final semantic pattern's coverage (or recall) is the fraction of total items in a discretized itemset tagged with a defect that are covered by the pattern. A final semantic pattern's interpretability can be quantified by various measures. Simpler semantic patterns (e.g., fewer sentences, fewer physical design features described per sentence) are preferred over more complex ones (e.g., more sentences, more physical design features per sentence). In some embodiments, a pattern's interpretability is based on the number of physical design features included in the pattern. For example, semantic patterns describing one physical design feature, e.g., "gate endcap spacing≤18 nm," is considered more interpretable than a pattern describing multiple features, e.g., "gate length=20 nm, gate endcap space≤18 nm." In other interpretability scoring schemes, the number of operators (less than, greater than, etc.) in a pattern can be considered as well. For example, the pattern "gate length≤18 nm" is more interpretable than the pattern "18 nm≤gate length≤24 nm." In yet other embodiments, the number of physical design features and operators per sentence can be considered to account for the simplicity of individual sentences in a semantic pattern. In some embodiments, a score can be assigned to an individual final semantic pattern's accuracy, coverage, and interpretability, with higher accuracy, higher coverage, and greater interpretability being given higher scores. A final score for individual final semantic pattern generated by the reduction method can be based any combination of an individual semantic pattern's accuracy, coverage and interpretability scores, and independence rankings. The total scores for a set of final semantic patterns can be used to produce a ranked list of final semantic patterns.

Figure 10:
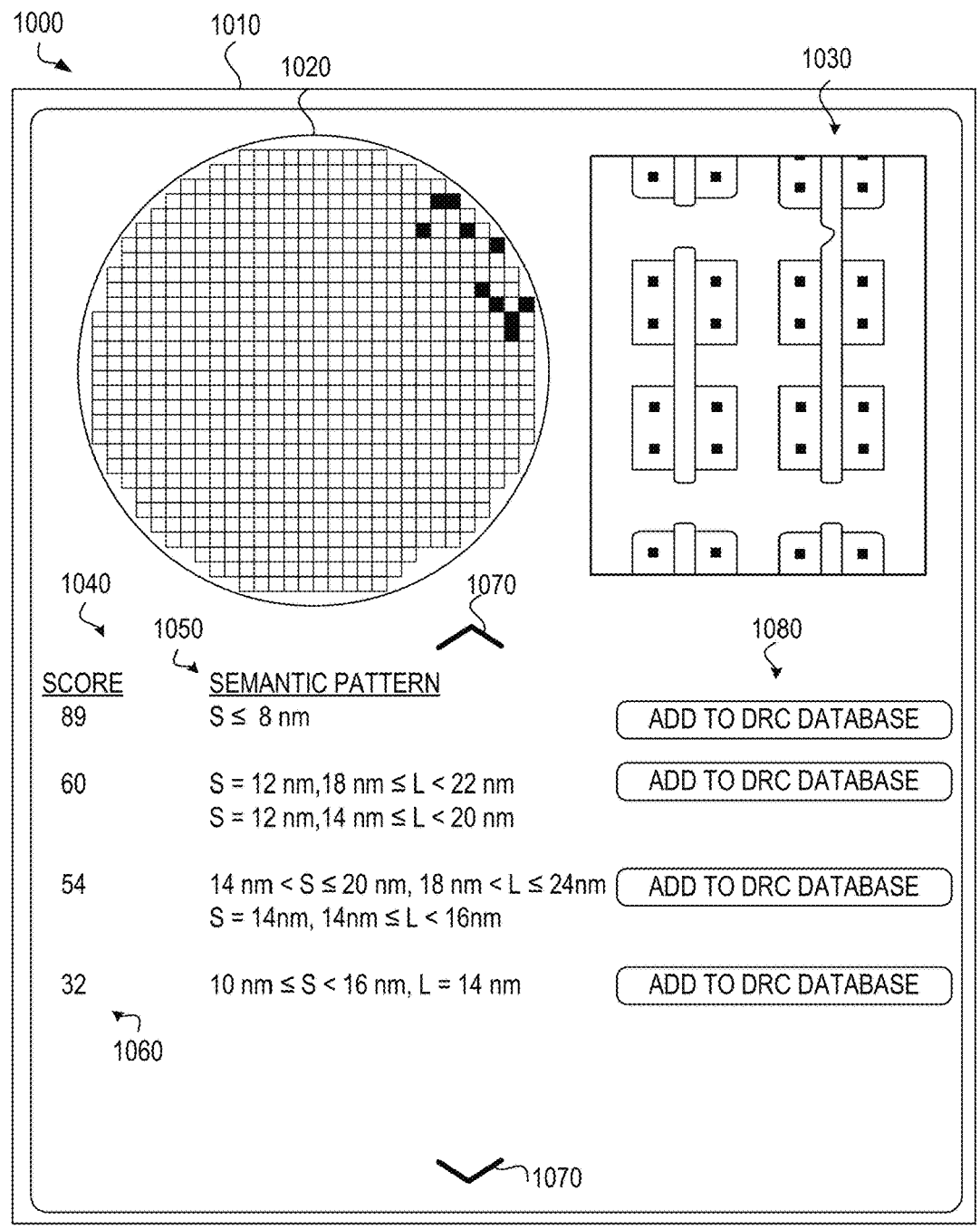
FIG. 10 illustrates an exemplary user interface of a semantic pattern extraction system.

FIG. 10 illustrates an exemplary user interface of a semantic pattern extraction system. The user interface 1000 can be displayed by semantic pattern extraction system 430 or 600. User interface 1000 comprises display 1010 showing defects on wafer map 1020, one or more SEM images 1030, and ranked list 1040 of semantic patterns extracted from silicon data. In some embodiments, wafer map 1020 can display a distribution of wafer defects in a variety of fashions. Wafer map 1020 shows defects at the die level and shows defects occurring in the upper right edge of the wafer. In some embodiments, the wafer map can show the distribution of multiple defect types simultaneously or allow a user to select one or more defects types to be displayed. In some embodiments, interface 1000 allows a user to select a wafer map and SEM images to be shown for a different wafer. SEM images 1030 can comprise a representative SEM image from a wafer, an SEM image corresponding to a defect selected from the wafer map 1020 by a user, or other SEM image. SEM images 1030 can comprise one SEM image or multiple SEM images.

Ranked list 1040 can display one or more semantic patterns 1050 in a ranked order. Semantic patterns 1050 can be the final semantic patterns generated by reduction methods described herein and ranking can be according to a final ranking of the final semantic patterns as described above. Scores 1060 for semantic patterns 1050 can be displayed. A user can use the semantic patterns to gain insights about a process under development or the health of an existing manufacturing process. The user can use the semantic patterns to help direct process development efforts. Any of the semantic patterns presented in the interface 1010 can be selected by a user for saving to a file for later reference by the user. Up and down arrow user interface elements 1070 can be utilized by a user to scroll through a set of final semantic patterns. Any of the selection elements 1080 can be selected by a user to have the corresponding semantic pattern be added to a design rule database for a manufacturing process. Addition of a selected semantic pattern to a DRC database can prevent physical design geometries and patterns described by the semantic pattern from being included in future physical designs, which may result in improved processing yields for future products designed using the updated DRC database.

In other embodiments, user interface 1010 can include different or additional user interface elements to allow for other actions to be taken automatically. For example, selection user interface elements can be added that cause a semantic pattern to be provided to an OPC generation tool, and the OPC tool can use the selected semantic pattern to update an existing OPC recipe or generate a new one. For example, upon receipt of a semantic pattern, OPC tool can modify an existing OPC recipe such that a different OPC pattern is generated for physical designs described by the selected semantic pattern. SEM images of defects associated with the selected semantic pattern can also be passed to the OPC tool so that the OPC tool can decide how to alter an OPC recipe to improve process yield. In some embodiments, the OPC tool can present multiple updated OPC recipes to a user and a user can select one or more updated OPC recipes to be used for mask generation.

Figure 11:
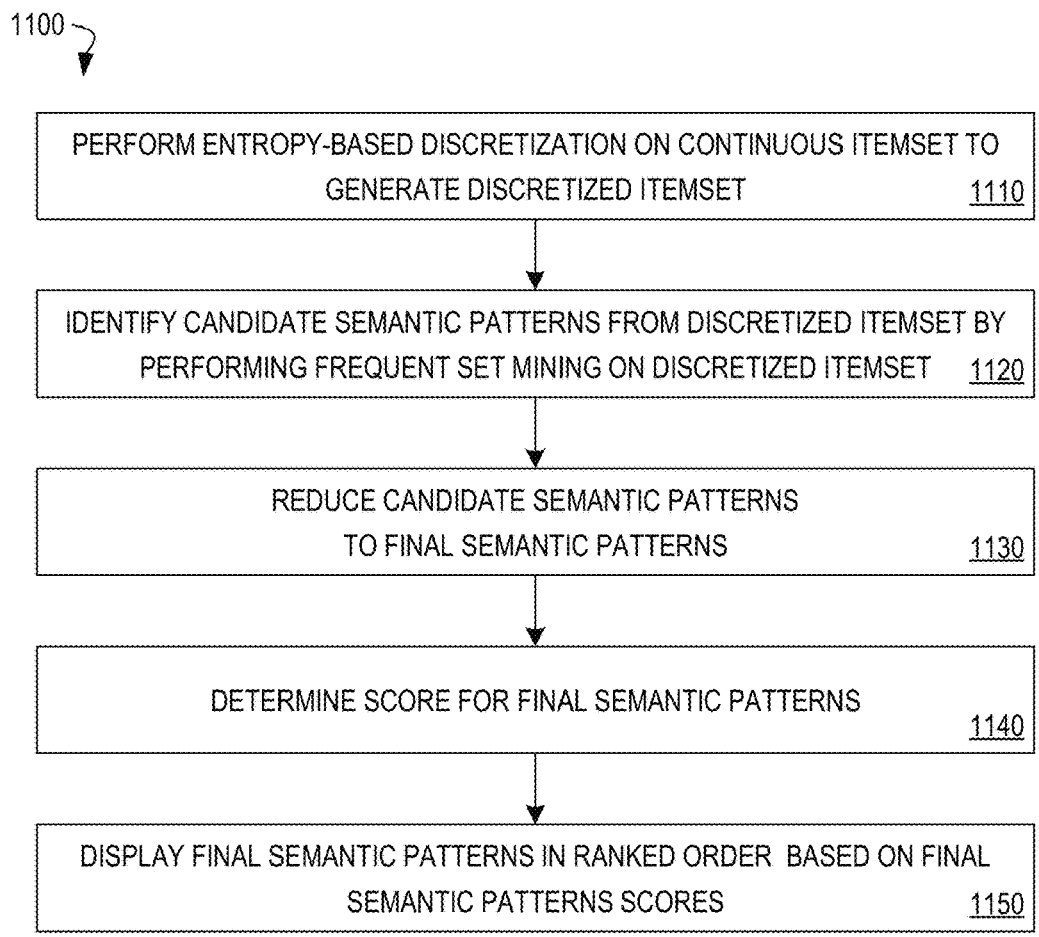
FIG. 11 illustrates a second exemplary method for generating semantic patterns from a continuous itemset.

FIG. 11 illustrates a second exemplary method for generating semantic patterns from a continuous itemset. The method 1100 can be performed by, for example, semantic pattern extraction system 430 or 600. At 1110, entropy-based discretization is performed on a continuous itemset to generate a discretized itemset. Individual items in the continuous itemset comprises a physical design feature value for one or more physical design features and an event value indicating the presence or absence of one or more manufacturing defects. At 1120, a set of candidate semantic patterns items is identified from the discretized itemset by performing frequent set mining on the discretized itemset. At 1130, the set of candidate semantic patterns to one or more final semantic patterns is reduced. At 1140, a score for individual of the final semantic patterns is determined. At 1150, the final semantic patterns are displayed in a ranked order is displayed, the ranked order based at least in part on the score for the individual final semantic patterns.

Method 1100 can optionally include additional actions. For example, a set of SEM images taken of one or more wafers during manufacturing is received. And, for individual areas of interest in the individual SEM images, generating one of the items in the continuous itemset.

While the technologies described herein have been discussed with application to semiconductor device manufacturing, they are applicable to other areas. For example, the disclosed technologies can be used to identify design parameters in other high-volume manufacturing processes involving the manufacture of devices with small features, such as printed circuit boards (PCBs). The technologies described herein could extract semantic patterns from a large set of image data collected during PCB manufacturing that describe PCB physical design geometries that may contribute to board defects.

The disclosed technologies can be used in other fields, such as, for example, driving. Modern cars can generate large amounts of data that capture that current state of the vehicle, such as speed, acceleration, passenger weight, cargo weight, location, time of day, weather conditions, internal noise level, dashcam images/video, tire pressure, etc. A snapshot of this data could be captured as a car maneuvers through a highway curve where accidents are known to occur. If vehicles taking this turn capture and send this data to a central service, including how well the car navigated the turn (whether the car made it through the turn without a problem, the car had to brake sharply upon entering the turn, the car spun off the road or got into an accident, etc.), over time, the central service could collect enough data to generate a continuous itemset from which semantic patterns could be extracted that may explain a rare event (an accident occurring or a driver temporarily losing control of the car). Exemplary semantic patterns in such an embodiment could be, "entry speed>43 mph" or "entry speed>30 mph, wipers on high." The central service could provide these semantic patterns to a fleet of cars, and the cars could warn drivers in the future if they are approaching the curve under conditions covered by the semantic rules.

The technologies, techniques and embodiments described herein can be performed by any of a variety of computing devices, including mobile devices (e.g., smartphones, handheld computers, tablet computers, laptop computers) and non-mobile devices (e.g., desktop computers, servers, rack-scale systems). As used herein, the term "computing devices" includes computing systems and includes devices comprising multiple discrete physical components.

Figure 12:
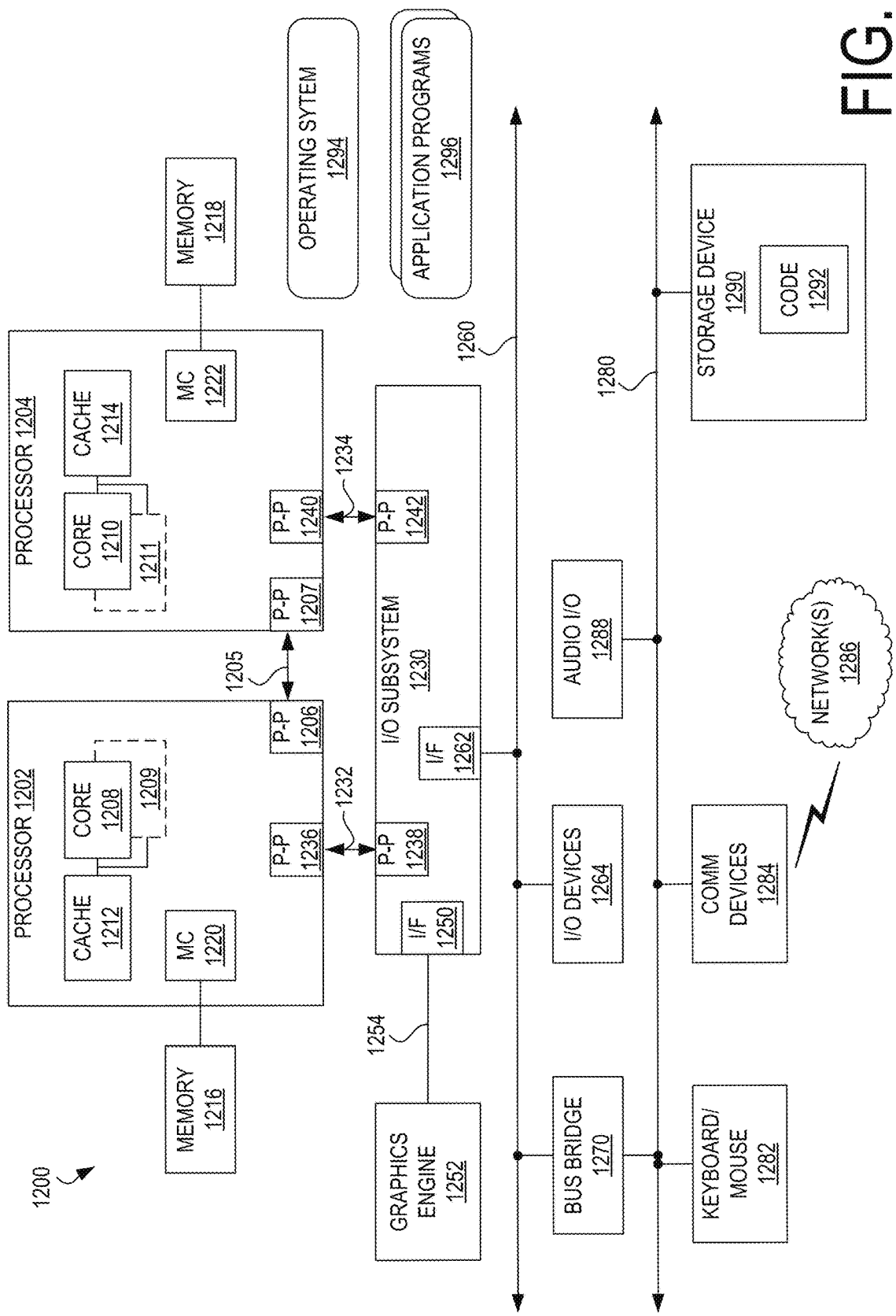
FIG. 12 is a block diagram of an exemplary computing device in which technologies described herein may be implemented.

FIG. 12 is a block diagram of an exemplary computing device 1200 in which technologies described herein may be implemented. Generally, components shown in FIG. 12 can communicate with other shown components, although not all connections are shown, for ease of illustration. The device 1200 is a multiprocessor system comprising a first processor 1202 and a second processor 1204 and is illustrated as comprising point-to-point (P-P) interconnects. For example, a point-to-point (P-P) interface 1206 of the processor 1202 is coupled to a point-to-point interface 1207 of the processor 1204 via a point-to-point interconnection 1205. It is to be understood that any or all point-to-point interconnects illustrated in FIG. 12 can be alternatively implemented as a multi-drop bus, and that any or all buses illustrated in FIG. 12 could be replaced by point-to-point interconnects.

As shown in FIG. 12, the processors 1202 and 1204 are multicore processors. Processor 1202 comprises processor cores 1208 and 1209, and processor 1204 comprises processor cores 1210 and 1211. Processor cores 1208-1211 can execute computer-executable instructions in a manner similar to that discussed below in connection with FIG. 13, or in other manners.

Processors 1202 and 1204 further comprise at least one shared cache memory 1212 and 1214, respectively. The shared caches 1212 and 1214 can store data (e.g., instructions) utilized by one or more components of the processor, such as the processor cores 1208-1209 and 1210-1211. The shared caches 1212 and 1214 can be part of a memory hierarchy for the device 1200. For example, the shared cache 1212 can locally store data that is also stored in a memory 1216 to allow for faster access to the data by components of the processor 1202. In some embodiments, the shared caches 1212 and 1214 can comprise multiple cache layers, such as level 1 (L1), level 2 (L2), level 3 (L3), level 4 (L4), and/or other caches or cache layers, such as a last level cache (LLC).

Although the device 1200 is shown with two processors, the device 1200 can comprise any number of processors. Further, a processor can comprise any number of processor cores. A processor can take various forms such as a central processing unit, a controller, a graphics processor, an accelerator (such as a graphics accelerator or digital signal processor (DSP)) or a field programmable gate array (FPGA). A processor in a device can be the same as or different from other processors in the device. In some embodiments, the device 1200 can comprise one or more processors that are heterogeneous or asymmetric to a first processor, accelerator, FPGA, or any other processor. There can be a variety of differences between the processing elements in a system in terms of a spectrum of metrics of merit including architectural, microarchitectural, thermal, power consumption characteristics and the like. These differences can effectively manifest themselves as asymmetry and heterogeneity amongst the processors in a system. In some embodiments, the processors 1202 and 1204 reside in the same die package.

Processors 1202 and 1204 further comprise memory controller logic (MC) 1220 and 1222. As shown in FIG. 12, MCs 1220 and 1222 control memories 1216 and 1218 coupled to the processors 1202 and 1204, respectively. The memories 1216 and 1218 can comprise various types of memories, such as volatile memory (e.g., dynamic random access memories (DRAM), static random access memory (SRAM)) or non-volatile memory (e.g., flash memory). While MCs 1220 and 1222 are illustrated as being integrated into the processors 1202 and 1204, in alternative embodiments, the MCs can be logic external to a processor, and can comprise one or more layers of a memory hierarchy.

Processors 1202 and 1204 are coupled to an Input/Output (I/O) subsystem 1230 via P-P interconnections 1232 and 1234. The point-to-point interconnection 1232 connects a point-to-point interface 1236 of the processor 1202 with a point-to-point interface 1238 of the I/O subsystem 1230, and the point-to-point interconnection 1234 connects a point-to-point interface 1240 of the processor 1204 with a point-to-point interface 1242 of the I/O subsystem 1230. Input/Output subsystem 1230 further includes an interface 1250 to couple I/O subsystem 1230 to a graphics engine 1252, which can be a high-performance graphics engine. The I/O subsystem 1230 and the graphics engine 1252 are coupled via a bus 1254. Alternately, the bus 1254 could be a point-to-point interconnection.

Input/Output subsystem 1230 is further coupled to a first bus 1260 via an interface 1262. The first bus 1260 can be a Peripheral Component Interconnect (PCI) bus, a PCI Express bus, another third generation I/O interconnection bus or any other type of bus.

Various I/O devices 1264 can be coupled to the first bus 1260. A bus bridge 1270 can couple the first bus 1260 to a second bus 1280. In some embodiments, the second bus 1280 can be a low pin count (LPC) bus. Various devices can be coupled to the second bus 1280 including, for example, a keyboard/mouse 1282, audio I/O devices 1288 and a storage device 1290, such as a hard disk drive, solid-state drive or other storage device for storing computer-executable instructions (code) 1292. The code 1292 can comprise computer-executable instructions for performing technologies described herein. Additional components that can be coupled to the second bus 1280 include communication device(s) 1284, which can provide for communication between the device 1200 and one or more wired or wireless networks 1286 (e.g. Wi-Fi, cellular or satellite networks) via one or more wired or wireless communication links (e.g., wire, cable, Ethernet connection, radio-frequency (RF) channel, infrared channel, Wi-Fi channel) using one or more communication standards (e.g., IEEE 802.11 standard and its supplements).

The device 1200 can comprise removable memory such as flash memory cards (e.g., SD (Secure Digital) cards), memory sticks, Subscriber Identity Module (SIM) cards). The memory in device 1200 (including caches 1212 and 1214, memories 1216 and 1218 and storage device 1290) can store data and/or computer-executable instructions for executing an operating system 1294 and application programs 1296. Example data includes web pages, text messages, images, sound files, video data, biometric thresholds for particular users or other data sets to be sent to and/or received from one or more network servers or other devices by the device 1200 via one or more wired or wireless networks, or for use by the device 1200. The device 1200 can also have access to external memory (not shown) such as external hard drives or cloud-based storage.

The operating system 1294 can control the allocation and usage of the components illustrated in FIG. 12 and support one or more application programs 1296. The application programs 1296 can include common mobile computing device applications (e.g., email applications, calendars, contact managers, web browsers, messaging applications) as well as other computing applications, such as a biometric cue masking application 1297 that can generate modified video from source video received by the device 1200 in which biometric cues present in the source video are substantially absent from the modified video.

The device 1200 can support various input devices, such as a touch screen, microphone, camera, physical keyboard, proximity sensor and trackball, and one or more output devices, such as a speaker and a display. Other possible input and output devices include piezoelectric and other haptic I/O devices. Any of the input or output devices can be internal to, external to or removably attachable with the device 1200. External input and output devices can communicate with the device 1200 via wired or wireless connections.

The device 1200 can further comprise one or more communication components 1284. The components 1284 can comprise wireless communication components coupled to one or more antennas to support communication between the system 1200 and external devices. The wireless communication components can support various wireless communication protocols and technologies such as Near Field Communication (NFC), Wi-Fi, Bluetooth, 4G Long Term Evolution (LTE), Code Division Multiplexing Access (CDMA), Universal Mobile Telecommunication System (UMTS) and Global System for Mobile Telecommunication (GSM). In addition, the wireless modems can support communication with one or more cellular networks for data and voice communications within a single cellular network, between cellular networks, or between the mobile computing device and a public switched telephone network (PSTN).

The device 1200 can further include at least one input/output port (which can be, for example, a USB, IEEE 1394 (FireWire), Ethernet and/or RS-232 port) comprising physical connectors; a power supply; a satellite navigation system receiver, such as a GPS receiver; a gyroscope; an accelerometer; a proximity sensor; and a compass. A GPS receiver can be coupled to a GPS antenna. The device 1200 can further include one or more additional antennas coupled to one or more additional receivers, transmitters and/or transceivers to enable additional functions.

It is to be understood that FIG. 12 illustrates only one exemplary computing device architecture. Computing devices based on alternative architectures can be used to implement technologies described herein. For example, instead of the processors 1202 and 1204, and the graphics engine 1252 being located on discrete integrated circuits, a computing device can comprise a SoC (system-on-a-chip) integrated circuit incorporating multiple processors, a graphics engine and additional components. Further, a computing device can connect elements via bus or point-to-point configurations different from that shown in FIG. 12. Moreover, the illustrated components in FIG. 12 are not required or all-inclusive, as shown components can be removed and other components added in alternative embodiments.

Figure 13:
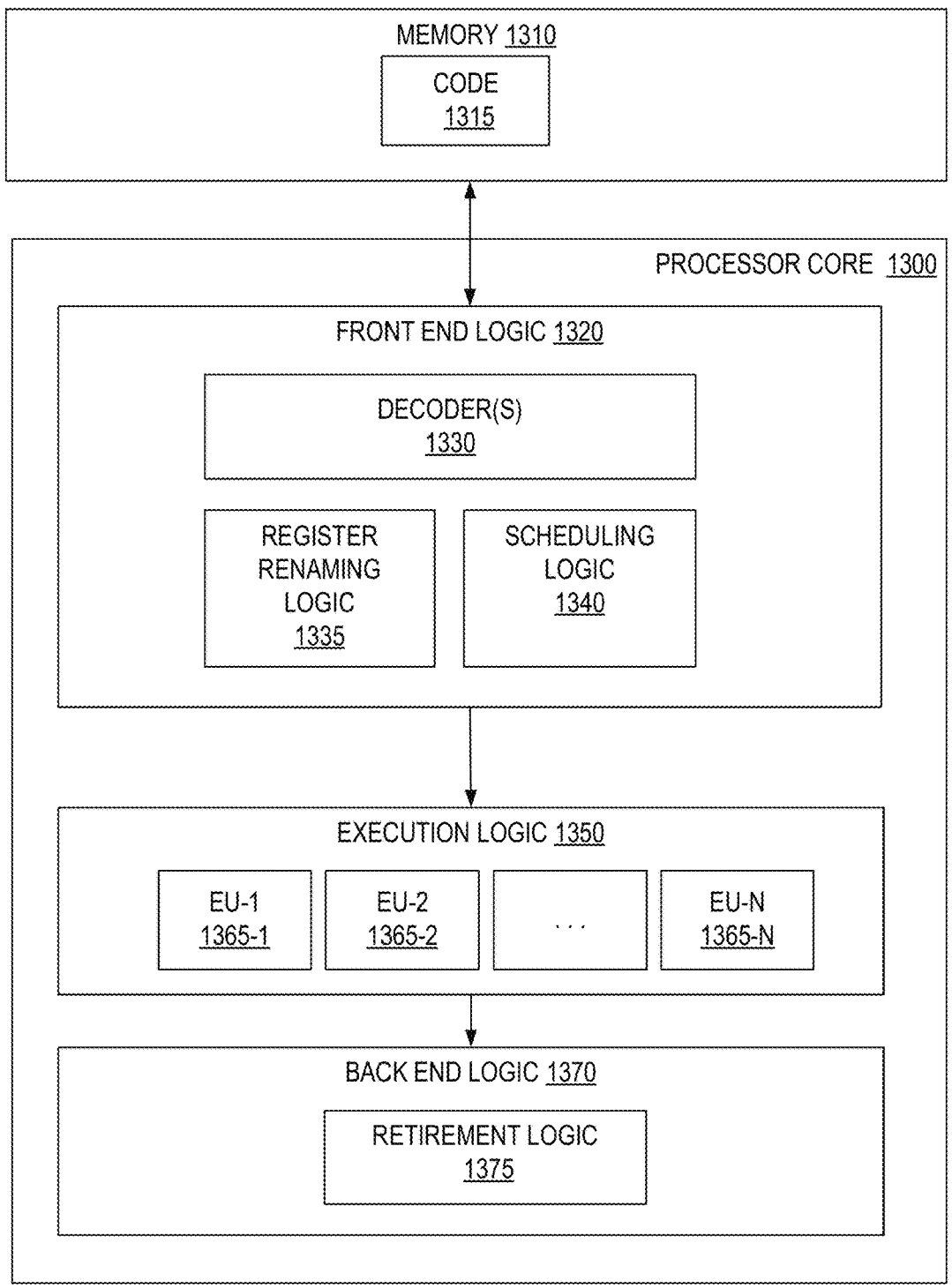
FIG. 13 is a block diagram of an exemplary processor core that can execute instructions as part of implementing technologies described herein.

FIG. 13 is a block diagram of an exemplary processor core 1300 to execute computer-executable instructions as part of implementing technologies described herein. The processor core 1300 can be a core for any type of processor, such as a microprocessor, an embedded processor, a digital signal processor (DSP) or a network processor. The processor core 1300 can be a single-threaded core or a multi-threaded core in that it may include more than one hardware thread context (or "logical processor") per core.

FIG. 13 also illustrates a memory 1310 coupled to the processor 1300. The memory 1310 can be any memory described herein or any other memory known to those of skill in the art. The memory 1310 can store computer-executable instruction 1315 (code) executable by the processor core 1300.

The processor core comprises front-end logic 1320 that receives instructions from the memory 1310. An instruction can be processed by one or more decoders 1330. The decoder 1330 can generate as its output a micro operation such as a fixed width micro operation in a predefined format, or generate other instructions, microinstructions, or control signals, which reflect the original code instruction. The front-end logic 1320 further comprises register renaming logic 1335 and scheduling logic 1340, which generally allocate resources and queues operations corresponding to converting an instruction for execution.

The processor core 1300 further comprises execution logic 1350, which comprises one or more execution units (EUs) 1365-1 through 1365-N. Some processor core embodiments can include several execution units dedicated to specific functions or sets of functions. Other embodiments can include only one execution unit or one execution unit that can perform a function. The execution logic 1350 performs the operations specified by code instructions. After completion of execution of the operations specified by the code instructions, back-end logic 1370 retires instructions using retirement logic 1375. In some embodiments, the processor core 1300 allows out of order execution but requires in-order retirement of instructions. Retirement logic 1370 can take a variety of forms as known to those of skill in the art (e.g., re-order buffers or the like).

The processor core 1300 is transformed during execution of instructions, at least in terms of the output generated by the decoder 1330, hardware registers and tables utilized by the register renaming logic 1335, and any registers (not shown) modified by the execution logic 1350. Although not illustrated in FIG. 13, a processor can include other elements on an integrated chip with the processor core 1300. For example, a processor may include additional elements such as memory control logic, one or more graphics engines, I/O control logic and/or one or more caches.

As used in any embodiment herein, the term "module" refers to logic that may be implemented in a hardware component or device, software or firmware running on a processor, or a combination thereof, to perform one or more operations consistent with the present disclosure. Software may be embodied as a software package, code, instructions, instruction sets and/or data recorded on non-transitory computer readable storage mediums. Firmware may be embodied as code, instructions or instruction sets and/or data that are hard-coded (e.g., nonvolatile) in memory devices.

As used in any embodiment herein, the term "circuitry" can comprise, for example, singly or in any combination, hardwired circuitry, programmable circuitry such as computer processors comprising one or more individual instruction processing cores, state machine circuitry, and/or firmware that stores instructions executed by programmable circuitry. Modules described herein may, collectively or individually, be embodied as circuitry that forms a part of one or more devices. Thus, any of the modules described herein can be implemented as circuitry, such as continuous itemset generation circuitry, entropy-based discretization circuitry, frequent set mining circuitry, reduction circuitry, etc. A computer device referred to as being programmed to perform a method can be programmed to perform the method via software, hardware, firmware or combinations thereof.

Any of the disclosed methods can be implemented as computer-executable instructions or a computer program product. Such instructions can cause a computer to perform any of the disclosed methods. Generally, as used herein, the term "computer" refers to any computing device or system described or mentioned herein, or any other computing device. Thus, the term "computer-executable instruction" refers to instructions that can be executed by any computing device described or mentioned herein, or any other computing device.

The computer-executable instructions or computer program products as well as any data created and used during implementation of the disclosed technologies can be stored on one or more tangible or non-transitory computer-readable storage media, such as optical media discs (e.g., DVDs, CDs), volatile memory components (e.g., DRAM, SRAM), or non-volatile memory components (e.g., flash memory, solid state drives, chalcogenide-based phase-change non-volatile memories). Computer-readable storage media can be contained in computer-readable storage devices such as solid-state drives, USB flash drives, and memory modules. Alternatively, the computer-executable instructions may be performed by specific hardware components that contain hardwired logic for performing all or a portion of disclosed methods, or by any combination of computer-readable storage media and hardware components.

The computer-executable instructions can be part of, for example, a dedicated software application or a software application that is accessed via a web browser or other software application (such as a remote computing application). Such software can be read and executed by, for example, a single computing device or in a network environment using one or more networked computers. Further, it is to be understood that the disclosed technology is not limited to any specific computer language or program. For instance, the disclosed technologies can be implemented by software written in C++, Java, Perl, JavaScript, Adobe Flash, or any other suitable programming language. Likewise, the disclosed technologies are not limited to any particular computer or type of hardware.

Furthermore, any of the software-based embodiments (comprising, for example, computer-executable instructions for causing a computer to perform any of the disclosed methods) can be uploaded, downloaded or remotely accessed through a suitable communication means. Such suitable communication means include, for example, the Internet, the World Wide Web, an intranet, cable (including fiber optic cable), magnetic communications, electromagnetic communications (including RF, microwave, and infrared communications), electronic communications, or other such communication means.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrase "at least one of A, B or C" can mean A; B; C; A and B; A and C; B and C; or A, B and C.

The disclosed methods, apparatuses and systems are not to be construed as limiting in any way. Instead, the present disclosure is directed toward all novel and nonobvious features and aspects of the various disclosed embodiments, alone and in various combinations and subcombinations with one another. The disclosed methods, apparatuses, and systems are not limited to any specific aspect or feature or combination thereof, nor do the disclosed embodiments require that any one or more specific advantages be present, or problems be solved.

Theories of operation, scientific principles or other theoretical descriptions presented herein in reference to the apparatuses or methods of this disclosure have been provided for the purposes of better understanding and are not intended to be limiting in scope. The apparatuses and methods in the appended claims are not limited to those apparatuses and methods that function in the manner described by such theories of operation.

Although the operations of some of the disclosed methods are described in a particular, sequential order for convenient presentation, it is to be understood that this manner of description encompasses rearrangement, unless a particular ordering is required by specific language set forth herein. For example, operations described sequentially may in some cases be rearranged or performed concurrently. Moreover, for the sake of simplicity, the attached figures may not show the various ways in which the disclosed methods can be used in conjunction with other methods.

The following examples pertain to additional embodiments of technologies disclosed herein.

Example 1 is a method comprising performing an entropy-based discretization on a continuous itemset to generate a discretized itemset, individual of the items in the continuous itemset comprising a physical design feature value for one or more physical design features and an event value indicating the presence or absence of one or more manufacturing defects; identifying a set of candidate semantic patterns from the discretized itemset by performing frequent set mining on the discretized itemset; reducing the set of candidate semantic patterns to one or more final semantic patterns; determining a score for individual of the final semantic patterns; and displaying the final semantic patterns on a display in a ranked order, the ranked order based at least in part on the score for the individual final semantic patterns.

Example 2 is the method of Example 1, wherein the discretized itemset comprises the items of the continuous itemset with one or more of the physical design feature values replaced by a discretized physical design value or range from a set of discretized physical design feature values or ranges for the respective physical design feature.

Example 3 is the method of Example 1, the determining the score for individual of the final semantic patterns comprising determining one or more of an accuracy score, a coverage score, and an interpretability score for the individual final semantic patterns, the score for the individual of the final semantic patterns based at least in part on one or more of the accuracy score, the coverage score, and the interpretability score.

Example 4 is the method of Example 3, wherein the interpretability score for the individual final semantic patterns is based at least in part on the number of physical design features represented by the one or more physical design feature values in the individual final semantic patterns.

Example 5 is the method of Example 3, the reducing the set of candidate final semantic patterns to one or more final semantic patterns comprising determining an independence ranking for individual of the final semantic patterns, the score for the individual final semantic patterns being further based at least in part on the independence ranking of the individual final semantic patterns.

Example 6 is the method of Example 1, further comprising receiving a user selection of at least one of the final semantic patterns and modifying a design rule database based at least in part on the at least one selected final semantic patterns.

Example 7 is the method of Example 1, further comprising receiving a user selection of at least one of the final semantic patterns and modifying an OPC recipe based at least in part on the at least one selected sematic patterns.

Example 8 is the method of Example 7, further comprising generating mask data based at least in part on the modified OPC recipe.

Example 9 is the method of Example 8, further comprising generating one or more photolithography masks based at least in part on the mask data.

Example 10 is the method of Example 1, wherein the reducing comprises representing the candidate semantic patterns in a graph, wherein nodes in the graph are associated with individual of the candidate semantic patterns and edges in the graph connect nodes associated with candidate semantic patterns that are not independent from each other.

Example 11 is the method of Example 10, the reducing further comprising performing a greedy algorithm to determine one or more least-connected nodes, the one or more least-connected nodes having zero edges or the least number of edges to neighboring nodes in the graph among the nodes in the graph; for individual of the one or more least-connected nodes: collectively identifying the candidate semantic patterns associated with the individual least-connected nodes and the candidate semantic patterns associated with any neighboring nodes connected to the individual least-connected node in the graph as one of the final semantic patterns; removing the individual least-connected node and any neighboring nodes connected to the individual least-connected node from the graph; and assigning an independence ranking to the final semantic pattern; and iteratively performing the greedy algorithm until the graph is empty, the independence rankings of the final semantic patterns identified in earlier iterations of the greedy algorithm being greater than independence ranking of final semantic patterns identified in later iterations of the greedy algorithm.

Example 12 is the method of Example 1, further comprising receiving a set of SEM images taken of one or more wafers during manufacture of the one or more wafers; and for individual of the SEM images, for individual of one or more areas of interest in the individual SEM images, generating one of the items in the continuous itemset.

Example 13 is the method of Example 12, further comprising, for the individual area of interest in the individual SEM images: extracting one or more as-processed feature contours; determining the presence or absence of the one or more manufacturing defects based at least in part on the individual SEM image; and correlating the as-processed features contours to one or more correlated physical design feature values in a physical design; wherein the physical design feature values for the item generated for the individual area of interest comprises the correlated physical design feature value and the event value for the item generated for the individual area of interest indicates the presence or absence of the one or more manufacturing defects at the individual area of interest.

Example 14 is the method of Example 1, further comprising receiving a set of TEM images of one or more manufactured wafers; and generating at least one of the items in the continuous itemset based at least in part on individual of the TEM images.

Example 15 is the method of Example 1, further comprising receiving diagnostic data measured from one or more manufactured wafers; and generating at least one of the items in the continuous itemset based at least in part on the diagnostic data.

Example 16 is a semantic pattern extraction system comprising one or more processors and one or more computer-readable storage media storing instructions thereon for causing the one or more processors to perform the method of any of the Examples 1-15.

Example 17 is one or more computer-readable storage media storing instructions thereon for causing a computing device to perform the method of any of the Examples 1-15.

Example 18 is a semantic pattern extraction system comprising a discretization means for performing entropy-based discretization on a continuous itemset to generate a discretized itemset, individual of the items in the continuous itemset comprising a physical design feature value for one or more physical design features and an event value indicating the presence or absence of one or more manufacturing defects; a mining means for identifying a set of candidate semantic patterns from the discretized itemset by performing frequent set mining on the discretized itemset; a reduction means for reducing the set of candidate semantic patterns to one or more final semantic patterns; a scoring means for determining a score for individual of the final semantic patterns; and a display means to display the final semantic patterns in a ranked order, the ranked order based at least in part on the score for the individual final semantic patterns.

Example 19 is the system of Example 18, wherein the discretized itemset comprises the items of the continuous itemset with one or more of the physical design feature values replaced by a discretized physical design value or range from a set of discretized physical design feature values or ranges for the respective physical design feature.

Example 20 is the system of Example 18, the determining the score for individual of the final semantic patterns comprising determining one or more of an accuracy score, a coverage score, and an interpretability score for the individual final semantic patterns, the score for the individual of the final semantic patterns based at least in part on one or more of the accuracy score, the coverage score, and the interpretability score.

Example 21 is the system of Example 20, wherein the interpretability score for the individual final semantic patterns is based at least in part on the number of physical design features represented by the one or more physical design feature values in the individual final semantic patterns.

Example 22 is the system of Example 20, the reducing the set of candidate final semantic patterns to one or more final semantic patterns comprising determining an independence ranking for individual of the final semantic patterns, the score for the individual final semantic patterns being further based at least in part on the independence ranking of the individual final semantic patterns.

Example 23 is the system of Example 22, wherein the reducing comprises representing the candidate semantic patterns in a graph, wherein nodes in the graph are associated with individual of the candidate semantic patterns and edges in the graph connect nodes associated with candidate semantic patterns that are not independent from each other.

Example 24 is the system of Example 23, the reducing further comprising: performing a greedy algorithm to determine one or more least-connected nodes, the one or more least-connected nodes having zero edges or the least number of edges to neighboring nodes in the graph among the nodes in the graph; for individual of the one or more least-connected nodes: collectively identifying the candidate semantic patterns associated with the individual least-connected nodes and the candidate semantic patterns associated with any neighboring nodes connected to the individual least-connected node in the graph as one of the final semantic patterns; removing the individual least-connected node and any neighboring nodes connected to the individual least-connected node from the graph; and assigning an independence ranking to the final semantic pattern; and iteratively performing the greedy algorithm until the graph is empty, the independence rankings of the final semantic patterns identified in earlier iterations of the greedy algorithm being greater than independence ranking of final semantic patterns identified in later iterations of the greedy algorithm.

Example 25 is sematic pattern extraction system comprising an entropy-based discretization module to perform an entropy-based discretization on a continuous itemset to generate a discretized itemset, individual of the items in the continuous itemset comprising a physical design feature value for one or more physical design features and an event value indicating the presence or absence of one or more manufacturing defects; a discretization module to identify a set of candidate semantic patterns from the discretized itemset by performing frequent set mining on the discretized itemset; a reduction module to reduce the set of candidate semantic patterns to one or more final semantic patterns and determine a score for individual of the final semantic patterns; and a display module to display the final semantic patterns on a display in a ranked order, the ranked order based at least in part on the score for the individual final semantic patterns.

Example 26 the system of Example 25, wherein the discretized itemset comprises the items of the continuous itemset with one or more of the physical design feature values replaced by a discretized physical design value or range from a set of discretized physical design feature values or ranges for the respective physical design feature.

Example 27 the system of Example 25, the determining the score for individual of the final semantic patterns comprising determining one or more of an accuracy score, a coverage score, and an interpretability score for the individual final semantic patterns, the score for the individual of the final semantic patterns based at least in part on one or more of the accuracy score, the coverage score, and the interpretability score.

Example 28 the system of Example 27, wherein the interpretability score for the individual final semantic patterns is based at least in part on the number of physical design features represented by the one or more physical design feature values in the individual final semantic patterns.

Example 29 the system of Example 27, the reducing the set of candidate final semantic patterns to one or more final semantic patterns comprising determining an independence ranking for individual of the final semantic patterns, the score for the individual final semantic patterns being further based at least in part on the independence ranking of the individual final semantic patterns.

Example 30 the system of Example 25, wherein the reducing comprises representing the candidate semantic patterns in a graph, wherein nodes in the graph are associated with individual of the candidate semantic patterns and edges in the graph connect nodes associated with candidate semantic patterns that are not independent from each other.

Example 31 the system of Example 30, the reducing further comprising: performing a greedy algorithm to determine one or more least-connected nodes, the one or more least-connected nodes having zero edges or the least number of edges to neighboring nodes in the graph among the nodes in the graph; for individual of the one or more least-connected nodes: collectively identifying the candidate semantic patterns associated with the individual least-connected nodes and the candidate semantic patterns associated with any neighboring nodes connected to the individual least-connected node in the graph as one of the final semantic patterns; removing the individual least-connected node and any neighboring nodes connected to the individual least-connected node from the graph; and assigning an independence ranking to the final semantic pattern; and iteratively performing the greedy algorithm until the graph is empty, the independence rankings of the final semantic patterns identified in earlier iterations of the greedy algorithm being greater than independence ranking of final semantic patterns identified in later iterations of the greedy algorithm.

We claim:

1. A semantic pattern extraction method comprising:
    performing an entropy-based discretization on a continuous itemset to generate a discretized itemset, individual of the items in the continuous itemset comprising a physical design feature value for one or more semiconductor device physical design features and an event value indicating the presence or absence of one or more semiconductor device manufacturing defects;
    identifying a set of candidate semantic patterns from the discretized itemset by performing frequent set mining on the discretized itemset;
    reducing the set of candidate semantic patterns to one or more final semantic patterns, individual of the candidate semantic patterns and final semantic patterns comprising one or more sentences or phrases describing constraints on physical design feature values of at least one of the one or more semiconductor device physical design features;
    determining a score for individual of the final semantic patterns; and
    displaying the final semantic patterns on a display in a ranked order, the ranked order based at least in part on the score for the individual final semantic patterns.

2. The method of claim 1, wherein the discretized itemset comprises the items of the continuous itemset with one or more of the physical design feature values replaced by a discretized physical design value or range from a set of discretized physical design feature values or ranges for the respective semiconductor device physical design feature.

3. The method of claim 1, the determining the score for individual of the final semantic patterns comprising determining at least one of an accuracy score, a coverage score, or an interpretability score for the individual final semantic patterns, the score for the individual of the final semantic patterns based at least in part on the at least one of the accuracy score, the coverage score, and the interpretability score.

4. The method of claim 3, wherein the interpretability score for the individual final semantic patterns is based at least in part on the number of semiconductor device physical design features represented by the one or more physical design feature values in the individual final semantic patterns.

5. The method of claim 3, the reducing the set of candidate final semantic patterns to one or more final semantic patterns comprising determining an independence ranking for individual of the final semantic patterns, the score for the individual final semantic patterns being further based at least in part on the independence ranking of the individual final semantic patterns.

6. The method of claim 1, further comprising receiving a user selection of at least one of the final semantic patterns and modifying a design rule database based at least in part on the at least one selected final semantic patterns.

7. The method of claim 1, further comprising receiving a user selection of at least one of the final semantic patterns and modifying an OPC (optical proximity correction) recipe based at least in part on the at least one selected semantic patterns.

8. The method of claim 7, further comprising generating mask data based at least in part on the modified OPC recipe.

9. The method of claim 8, further comprising generating one or more photolithography masks based at least in part on the mask data.

10. The method of claim 1, wherein the reducing comprises representing the candidate semantic patterns in a graph, wherein nodes in the graph are associated with individual of the candidate semantic patterns and edges in the graph connect nodes associated with candidate semantic patterns that are not independent from each other.

11. The method of claim 10, the reducing further comprising:
performing a greedy algorithm to determine one or more least-connected nodes, the one or more least-connected nodes having zero edges or the least number of edges to neighboring nodes in the graph among the nodes in the graph;
for individual of the one or more least-connected nodes:
collectively identifying the candidate semantic patterns associated with the individual least-connected nodes and the candidate semantic patterns associated with any neighboring nodes connected to the individual least-connected node in the graph as one of the final semantic patterns;
removing the individual least-connected node and any neighboring nodes connected to the individual least-connected node from the graph; and
assigning an independence ranking to the final semantic pattern; and
iteratively performing the greedy algorithm until the graph is empty, the independence rankings of the final semantic patterns identified in earlier iterations of the greedy algorithm being greater than independence ranking of final semantic patterns identified in later iterations of the greedy algorithm.

12. The method of claim 1, further comprising adding at least one of the final semantic patterns to a design rule database.

13. The method of claim 12, further comprising checking a semiconductor device physical design for design rule violations using the design rule database comprising the added at least one final sematic patterns.

14. A semantic pattern extraction system comprising:
one or more processors;
one or more computer-readable storage media storing instructions thereon for causing the one or more processors to perform a method comprising:
performing an entropy-based discretization on a continuous itemset to generate a discretized itemset, individual of the items in the continuous itemset comprising a physical design feature value for one or more semiconductor device physical design features and an event value indicating the presence or absence of one or more semiconductor device manufacturing defects;
identifying a set of candidate semantic patterns from the discretized itemset by performing frequent set mining on the discretized itemset;
reducing the set of candidate semantic patterns to one or more final semantic patterns, individual of the candidate semantic patterns and final semantic patterns comprising one of more sentences or phrases describing constraints on physical design feature values of at least one of the one or more semiconductor device physical design features;
determining a score for individual of the final semantic patterns; and
displaying the final semantic patterns on a display in a ranked order, the ranked order based at least in part on the score for the individual final semantic patterns.

15. The semantic pattern extraction system of claim 14, wherein the discretized itemset comprises the items of the continuous itemset with one or more of the physical design feature values replaced by a discretized physical design value or range from a set of discretized physical design feature values or ranges for the respective semiconductor device physical design feature.

16. The semantic pattern extraction system of claim 14, the determining the score for individual of the final semantic patterns comprising determining at least one of an accuracy score, a coverage score, or an interpretability score for the individual final semantic patterns, the score for the individual of the final semantic patterns based at least in part on the at least one of the accuracy score, the coverage score, and the interpretability score.

17. The semantic pattern extraction system of claim 16, the reducing the set of candidate final semantic patterns to one or more final semantic patterns comprising determining an independence ranking for individual of the final semantic patterns, the score for the individual final semantic patterns being further based at least in part on the independence ranking of the individual final semantic patterns.

18. One or more computer-readable storage media storing instructions thereon for causing a computing device to perform a method comprising:
performing an entropy-based discretization on a continuous itemset to generate a discretized itemset, individual of the items in the continuous itemset comprising a physical design feature value for one or more semiconductor device physical design features and an event value indicating the presence or absence of one or more semiconductor device manufacturing defects;
identifying a set of candidate semantic patterns from the discretized itemset by performing frequent set mining on the discretized itemset;
reducing the set of candidate semantic patterns to one or more final semantic patterns, individual of the candidate semantic patterns and final semantic patterns comprising one or more sentences or phrases describing constraints on physical design feature values of at least one of the one or more semiconductor device physical design features;
determining a score for individual of the final semantic patterns; and displaying the final semantic patterns on a display in a ranked order, the ranked order based at least in part on the score for the individual final semantic patterns.

19. The one or more computer-readable storage media of claim 18, wherein the discretized itemset comprises the items of the continuous itemset with one or more of the physical design feature values replaced by a discretized physical design value or range from a set of discretized physical design feature values or ranges for the respective semiconductor device physical design feature.

20. The one or more computer-readable storage media of claim 18, the determining the score for individual of the final semantic patterns comprising determining at least one of an accuracy score, a coverage score, or an interpretability score for the individual final semantic patterns, the score for the individual of the final semantic patterns based at least in part on the at least one of the accuracy score, the coverage score, and the interpretability score.

21. The one or more computer-readable storage media of claim 20, wherein the interpretability score for the individual final semantic patterns is based at least in part on the number of semiconductor device physical design features represented by the one or more physical design feature values in the individual final semantic patterns.

22. The one or more computer-readable storage media of claim 20, the reducing the set of candidate final semantic patterns to one or more final semantic patterns comprising determining an independence ranking for individual of the final semantic patterns, the score for the individual final semantic patterns being further based at least in part on the independence ranking of the individual final semantic patterns.

23. The one or more computer-readable storage media of claim 18, the reducing comprising:
representing the candidate semantic patterns in a graph, wherein nodes in the graph are associated with individual of the candidate semantic patterns and edges in the graph connect nodes associated with candidate semantic patterns that are not independent from each other;
performing a greedy algorithm to determine one or more least-connected nodes, the one or more least-connected nodes having zero edges or the least number of edges to neighboring nodes in the graph among the nodes in the graph;
for individual of the one or more least-connected nodes:
collectively identifying the candidate semantic patterns associated with the individual least-connected nodes and the candidate semantic patterns associated with any neighboring nodes connected to the individual least-connected node in the graph as one of the final semantic patterns;
removing the individual least-connected node and any neighboring nodes connected to the individual least-connected node from the graph; and
assigning an independence ranking to the final semantic pattern; and
iteratively performing the greedy algorithm until the graph is empty, the independence rankings of the final semantic patterns identified in earlier iterations of the greedy algorithm being greater than independence ranking of final semantic patterns identified in later iterations of the greedy algorithm.

24. The one or more computer-readable storage media of claim 18, the method further comprising:
receiving a set of SEM (scanning electron microscope) images taken of one or more wafers during manufacture of the one or more wafers; and
for individual of the SEM images, for individual of one or more areas of interest in the individual SEM images, generating one of the items in the continuous itemset.

25. The one or more computer-readable storage media of claim 24, the method further comprising:
for the individual area of interest in the individual SEM images:
extracting one or more as-processed feature contours;
determining the presence or absence of the one or more semiconductor device manufacturing defects based at least in part on the individual SEM image; and
correlating the as-processed feature contours to one or more correlated physical design feature values in a semiconductor device physical design;
wherein the physical design feature values for the item generated for the individual area of interest comprises the correlated physical design feature value and the event value for the item generated for the individual area of interest indicates the presence or absence of the one or more semiconductor device manufacturing defects at the individual area of interest.

26. A semantic pattern extraction system comprising:
a discretization means for performing entropy-based discretization on a continuous itemset to generate a discretized itemset, individual of the items in the continuous itemset comprising a physical design feature value for one or more semiconductor device physical design features and an event value indicating the presence or absence of one or more semiconductor device manufacturing defects;
a mining means for identifying a set of candidate semantic patterns from the discretized itemset by performing frequent set mining on the discretized itemset;
a reduction means for reducing the set of candidate semantic patterns to one or more final semantic patterns, individual of the candidate semantic patterns and final semantic patterns comprising one or more sentences or phrases describing constraints on physical design feature values of at least one of the one or more semiconductor device physical design features;
a scoring means for determining a score for individual of the final semantic patterns; and
a display means to display the final semantic patterns in a ranked order, the ranked order based at least in part on the score for the individual final semantic patterns.

27. The semantic pattern extraction system of claim 26, wherein the reducing comprises:
representing the candidate semantic patterns in a graph, wherein nodes in the graph are associated with individual of the candidate semantic patterns and edges in the graph connect nodes associated with candidate semantic patterns that are not independent from each other;
performing a greedy algorithm to determine one or more least-connected nodes, the one or more least-connected nodes having zero edges or the least number of edges to neighboring nodes in the graph among the nodes in the graph;
for individual of the one or more least-connected nodes:
collectively identifying the candidate semantic patterns associated with the individual least-connected nodes and the candidate semantic patterns associated with any neighboring nodes connected to the individual least-connected node in the graph as one of the final semantic patterns;

removing the individual least-connected node and any neighboring nodes connected to the individual least-connected node from the graph; and assigning an independence ranking to the final semantic pattern; and iteratively performing the greedy algorithm until the graph is empty, the independence rankings of the final semantic patterns identified in earlier iterations of the greedy algorithm being greater than independence ranking of final semantic patterns identified in later iterations of the greedy algorithm.

* * * * *